US011268022B2

(12) United States Patent
Ippen et al.

(10) Patent No.: US 11,268,022 B2
(45) Date of Patent: Mar. 8, 2022

(54) NANOSTRUCTURES WITH INORGANIC LIGANDS FOR ELECTROLUMINESCENT DEVICES

(71) Applicant: Nanosys, Inc., Milpitas, CA (US)

(72) Inventors: Christian Ippen, Cupertino, CA (US); John J. Curley, San Francisco, CA (US); Donald Zehnder, San Carlos, CA (US); Dylan Charles Hamilton, Oakland, CA (US); Benjamin Newmeyer, San Jose, CA (US); Ruiqing Ma, Morristown, NJ (US)

(73) Assignee: Nanosys, Inc., Milpitas, CA (US)

( * ) Notice: Subject to any disclaimer, the term of this patent is extended or adjusted under 35 U.S.C. 154(b) by 0 days.

(21) Appl. No.: 16/824,824

(22) Filed: Mar. 20, 2020

(65) Prior Publication Data
US 2020/0299575 A1    Sep. 24, 2020

Related U.S. Application Data

(60) Provisional application No. 62/987,034, filed on Mar. 9, 2020, provisional application No. 62/820,940, filed on Mar. 20, 2019.

(51) Int. Cl.
*C09K 11/70*    (2006.01)
*C09K 11/88*    (2006.01)
(Continued)

(52) U.S. Cl.
CPC ............ *C09K 11/70* (2013.01); *C09K 11/025* (2013.01); *C09K 11/565* (2013.01);
(Continued)

(58) Field of Classification Search
CPC ...... C09K 11/20; C09K 11/025; C09K 11/565; C09K 11/883; B82Y 20/00; B82Y 30/00; B82Y 40/00
See application file for complete search history.

(56) References Cited

U.S. PATENT DOCUMENTS 8,779,413 B1    7/2014 Landry
9,346,998 B2    5/2016 Talapin et al.
(Continued)

FOREIGN PATENT DOCUMENTS

WO    WO-2015117876 A1    8/2015
WO    WO 2016/186251    * 11/2016
(Continued)

OTHER PUBLICATIONS

Translation for WO 2016/186251, Nov. 24, 2016.*
(Continued)

*Primary Examiner* — C Melissa Koslow
(74) *Attorney, Agent, or Firm* — Sterne, Kessler, Goldstein & Fox P.L.L.C.

(57) ABSTRACT

The invention relates to highly stable nanostructures with inorganic ligands for electroluminescent devices, particularly nanostructure composition comprising at least one population of nanostructures; and at least one fluoride containing ligand bound to the surface of the nanostructure; wherein the fluoride containing ligand is selected from the group consisting of a fluorozincate, tetrafluoroborate, and hexafluorophosphate. The invention also relates to highly stable nanostructures comprising at least one population of nanostructures and fluoride anions bound to the surface of the nanostructure. The invention also relates to methods of producing such nanostructures.

19 Claims, 9 Drawing Sheets

(51) Int. Cl.
 *C09K 11/56* (2006.01)
 *H01L 51/50* (2006.01)
 *C09K 11/02* (2006.01)
 *B82Y 40/00* (2011.01)
 *B82Y 30/00* (2011.01)
 *B82Y 20/00* (2011.01)

(52) U.S. Cl.
 CPC .......... *C09K 11/883* (2013.01); *H01L 51/502* (2013.01); *B82Y 20/00* (2013.01); *B82Y 30/00* (2013.01); *B82Y 40/00* (2013.01)

(56) References Cited

U.S. PATENT DOCUMENTS 9,385,194 B2   7/2016  Cho et al.
9,862,841 B2 * 1/2018  Wheeler ............... H01L 31/028
2014/0209856 A1  7/2014  Landry
2016/0237344 A1  8/2016  Bakr et al.

FOREIGN PATENT DOCUMENTS

WO   WO 2017/017238      *  2/2017
WO   WO-2017079225 A1      5/2017

OTHER PUBLICATIONS

Dirin, D.N., et al., "Lead Halide Perovskites and Other Metal Halide Complexes as Inorganic Capping Ligands for Colloidal Nanocrystals," *J Am Chem Soc* 136(18):6550-6553, American Chemical Society, United States (2014).

Zhang, H., et al., "Colloidal Nanocrystals with Inorganic Halide, Pseudohalide, and Halometallate Ligands," *ACS Nano* 8(7):7359-7369, American Chemical Society, United States (2014).

* cited by examiner

QD-OA + TBAF → QD-F + TBA⁺ + OA⁻ in THF at 70C

Purify with ethanol/toluene 2x to remove excess TBA⁺OA⁻

Redisperse in toluene with DDA⁺Cl⁻

Precipitate with methyl acetate

Redisperse QD-F DDA⁺Cl⁻ in octane for device fabrication

FIG. 6

NANOSTRUCTURES WITH INORGANIC LIGANDS FOR ELECTROLUMINESCENT DEVICES

BACKGROUND OF THE INVENTION

Field of the Invention

The invention relates to the field of nanotechnology. More particularly, the invention relates to highly stable nanostructures with inorganic ligands for electroluminescent devices, particularly nanostructure composition comprising at least one population of nanostructures; and at least one fluoride containing ligand bound to the surface of the nanostructure; wherein the fluoride containing ligand is selected from the group consisting of a fluorozincate, tetrafluoroborate, and hexafluorophosphate. The invention also relates to highly stable nanostructures comprising at least one population of nanostructures containing fluoride anions bound to the surface of the nanostructure. The invention also relates to methods of producing such nanostructures.

Background Art

Semiconductor nanostructures can be incorporated into a variety of electronic and optical devices. The electrical and optical properties of such nanostructures vary, e.g., depending on their composition, shape, and size. For example, size-tunable properties of semiconductor nanostructures are of great interest for applications such as electroluminescent devices, lasers, and biomedical labeling. Highly luminescent nanostructures are particularly desirable for electroluminescent device applications.

Nanostructures in electroluminescent devices are subjected to relatively high voltages under operation (e.g. about 4 V for red nanostructures in a typical lifetime test), which can induce irreversible electrochemical reactions. Organic ligands can be susceptible to electrochemical oxidation. For example, thiolates can be oxidized to thiyl radicals or disulfides. Similarly, carboxylates can be oxidized irreversibly to carbon dioxide. The loss of these ligands results in a loss of luminescence and therefore device degradation. Hence it is desirable to passivate nanostructures with ligands that have a wide electrochemical window or exhibit reversible electrochemistry.

BRIEF SUMMARY OF THE INVENTION

The present invention provides a nanostructure composition comprising (a) at least one population of nanostructures; and (b) at least one fluoride containing ligand bound to the surface of the nanostructure; or (b') fluoride anions bound to the surface of the nanostructure. In some embodiments, the fluoride containing ligand is selected from the group consisting of a fluorozincate, tetrafluoroborate, and hexafluorophosphate.

In some embodiments, the nanostructure comprises a core and at least one shell.

In some embodiments, the core comprises Si, Ge, Sn, Se, Te, B, C, P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2OC$, or combinations thereof.

In some embodiments, the core comprises InP.

In some embodiments, the nanostructure comprises two shells.

In some embodiments, at least one shell comprises CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si, or alloys thereof.

In some embodiments, at least one shell comprises ZnSe.
In some embodiments, at least one shell comprises ZnS.
In some embodiments, at least one shell comprises a first shell comprising ZnSe and a second shell comprising ZnS.

In some embodiments, at least one fluoride containing ligand comprises an anion comprising fluorozincate and a cation comprising a metal ion. In some embodiments, the cation comprises a potassium ion.

In some embodiments, at least one fluoride containing ligand comprises an anion comprising a fluorozincate and a cation selected from the group consisting of a tetraalkylammonium, an alkylphosphonium, formamidinium, guanidinium, imidazolium, and pyridinium.

In some embodiments, the cation is tetraalkylammonium and is selected from the group consisting of dioctadecyldimethylammonium, dihexadecyldimethylammonium, ditetradecyldimethylammonium, didodecyldimethylammonium, didecyldimethylammonium, dioctyldimethylammonium, bis(ethylhexyl)dimethylammonium, octadecyltrimethylammonium, oleyltrimethylammonium, hexadecyltrimethylammonium, tetradecyltrimethylammonium, dodecyltrimethylammonium, decyltrimethylammonium, octyltrimethylammonium, phenylethyltrimethylammonium, benzyltrimethylammonium, phenyltrimethylammonium, benzylhexadecyldimethylammonium, benzyltetradecyldimethylammonium, benzyldodecyldimethylammonium, benzyldecyldimethylammonium, benzyloctyldimethylammonium, benzyltributylammonium, benzyltriethylammonium, tetrabutylammonium, tetrapropylammonium, diisopropyldimethylammonium, tetraethylammonium, and tetramethylammonium.

In some embodiments, the cation is alkylphosphonium and is selected from the group consisting of tetraphenylphosphonium, dimethyldiphenylphosphonium, methyltriphenoxyphosphonium, hexadecyltributylphosphonium, octyltributylphosphonium, tetradecyltrihexylphosphonium, tetrakis(hydroxymethyl)phosphonium, tetraoctylphosphonium, tetrabutylphosphonium, and tetramethylphosphonium.

In some embodiments, the molar ratio of fluorine atom in the fluoride containing ligand or fluoride anions bound to the nanostructure composition to zinc atom in the nanostructure composition is between about 0.1 and about 0.5. In some embodiments, the molar ratio of fluorine atom in the fluoride containing ligand or fluoride anions bound to the nanostructure composition to zinc atom in the nanostructure composition is about 0.32.

In some embodiments, the nanostructure composition further comprises a solvent.

In some embodiments, the solvent is selected from the group consisting of hexane, heptane, octane, toluene, chloroform, and N-methylformamide.

In some embodiments, the solvent is a non-polar solvent.
In some embodiments, the nanostructure composition further comprises a surfactant.

In some embodiments, the surfactant is selected from the group consisting of tetramethylammonium acetate, dioctadecyldimethylammonium bromide, dihexadecyldimethylammonium bromide, ditetradecyldimethylammonium bromide, didodecyldimethylammonium bromide, didecyldimethylammonium bromide, dioctyldimethylammonium bromide, bis(ethylhexyl)dimethylammonium bromide, octadecyltrimethylammonium bromide, oleyltrimethylammonium bromide, hexadecyltrimethylammonium bromide, tetradecyltrimethylammonium bromide, dodecyltrimethylammonium bromide, decyltrimethylammonium bromide, octyltrimethylammonium bromide, phenylethyltrimethylammonium bromide, benzyltrimethylammonium bromide, phenyltrimethylammonium bromide, benzylhexadecyldimethylammonium bromide, benzyltetradecyldimethylammonium bromide, benzyldodecyldimethylammonium bromide, benzyldecyldimethylammonium bromide, benzyloctyldimethylammonium bromide, benzyltributylammonium bromide, benzyltriethylammonium bromide, tetrabutylammonium bromide, tetrapropylammonium bromide, diisopropyldimethylammonium bromide, tetraethylammonium bromide, tetramethylammonium bromide, tetraphenylphosphonium bromide, dimethyldiphenylphosphonium bromide, methyltriphenoxyphosphonium bromide, hexadecyltributylphosphonium bromide, octyltributylphosphonium bromide, tetradecyltrihexylphosphonium bromide, tetrakis(hydroxymethyl)phosphonium bromide, tetraoctylphosphonium bromide, tetrabutylphosphonium bromide, tetramethylphosphonium bromide, dodecylammonium bromide, dioctadecyldimethylammonium chloride, dihexadecyldimethylammonium chloride, ditetradecyldimethylammonium chloride, didodecyldimethylammonium chloride, didecyldimethylammonium chloride, dioctyldimethylammonium chloride, bis(ethylhexyl)dimethylammonium chloride, octadecyltrimethylammonium chloride, oleyltrimethylammonium chloride, hexadecyltrimethylammonium chloride, tetradecyltrimethylammonium chloride, dodecyltrimethylammonium chloride, decyltrimethylammonium chloride, octyltrimethylammonium chloride, phenylethyltrimethylammonium chloride, benzyltrimethylammonium chloride, phenyltrimethylammonium chloride, benzylhexadecyldimethylammonium chloride, benzyltetradecyldimethylammonium chloride, benzyldodecyldimethylammonium chloride, benzyldecyldimethylammonium chloride, benzyloctyldimethylammonium chloride, benzyltributylammonium chloride, benzyltriethylammonium chloride, tetrabutylammonium chloride, tetrapropylammonium chloride, diisopropyldimethylammonium chloride, tetraethylammonium chloride, tetramethylammonium chloride, tetraphenylphosphonium chloride, dimethyldiphenylphosphonium chloride, methyltriphenoxyphosphonium chloride, hexadecyltributylphosphonium chloride, octyltributylphosphonium chloride, tetradecyltrihexylphosphonium chloride, tetrakis(hydroxymethyl)phosphonium chloride, tetraoctylphosphonium chloride, tetrabutylphosphonium chloride, tetramethylphosphonium chloride, and dodecylammonium chloride.

In some embodiments, the nanostructure composition exhibits a photoluminescence quantum yield of between about 60% and about 99%. In some embodiments, the nanostructure composition exhibits a photoluminescence quantum yield of between about 70% and about 90%.

In some embodiments, the nanostructure composition exhibits a photoluminescence peak wavelength of between about 600 nm and about 650 nm.

In some embodiments, the nanostructure composition exhibits a photoluminescence peak wavelength of between about 510 nm and about 560 nm.

In some embodiments, the nanostructure composition exhibits a photoluminescence peak wavelength of between about 420 nm and about 470 nm.

In some embodiments, the fluoride containing ligand is a salt of tetrafluorozincate or dichlorodifluorozincate.

In some embodiments, the fluoride containing ligand is a tetrabutylammonium tetrafluorozincate or tetrabutylammonium dichlorodifluorozincate.

In some embodiments, the nanostructures comprise a core comprising InP, at least one shell comprising ZnSe, at least one shell comprising ZnS, and at least one fluoride containing ligand comprising tetrafluorozincate or dichlorodifluorozincate.

In some embodiments, the nanostructures are quantum dots.

The present invention also provides a method of preparing a nanostructure composition, the method comprising: (a) providing at least one population of nanostructures; and (b) admixing at least one fluoride containing ligand with the nanostructures; or (b') admixing tetraalkylammonium fluoride with the nanostructures of (a), to produce a nanostructure composition.

In some embodiments, the fluoride containing ligand is selected from the group consisting of a fluorozincate, tetrafluoroborate, and hexafluorophosphate.

In some embodiments, at least one fluoride containing ligand comprises an anion comprising a fluorozincate and an inorganic cation comprising a metal ion. In some embodiments, the inorganic cation comprises a potassium ion.

In some embodiments, the method further comprises (c) admixing at least one organic cation with the nanostructures of (b) or (b') to produce a nanostructure composition.

In some embodiments, the admixing in (b') is with a tetralkylammonium fluoride where the tetralkylammonium is selected from the group consisting of dioctadecyldimethylammonium, dihexadecyldimethylammonium, ditetradecyldimethylammonium, didodecyldimethylammonium, didecyldimethylammonium, dioctyldimethylammonium, bis(ethylhexyl)dimethylammonium, octadecyltrimethylammonium, oleyltrimethylammonium, hexadecyltrimethylammonium, tetradecyltrimethylammonium, dodecyltrimethylammonium, decyltrimethylammonium, octyltrimethylammonium, phenylethyltrimethylammonium, benzyltrimethylammonium, phenyltrimethylammonium, benzylhexadecyldimethylammonium, benzyltetradecyldimethylammonium, benzyldodecyldimethylammonium, benzyldecyldimethylammonium, benzyloctyldimethylammonium, benzyltributylammonium, benzyltriethylammonium, tetrabutylammonium, tetrapropylammonium, diisopropyldimethylammonium, tetraethylammonium, and tetramethylammonium.

In some embodiments, the organic cation is selected from the group consisting of a tetraalkylammonium, an alkylphosphonium, formamidinium, guanidinium, imidazolium, and pyridinium.

In some embodiments, the organic cation is tetraalkylammonium and is selected from the group consisting of dioctadecyldimethylammonium, dihexadecyldimethylammonium, ditetradecyldimethylammonium, didodecyldimethylammonium, didecyldimethylammonium, dioctyldimethylammonium, bis(ethylhexyl)dimethylammonium, octadecyltrimethylammonium, oleyltrimethylammonium, hexadecyltrimethylammonium, tetradecyltrimethylammonium, dodecyltrimethylammonium, decyltrimethylammonium, octyltrimethylammonium, phenylethyltrimethylammonium, benzyltrimethylammonium, phenyltrimethylammonium, benzylhexadecyldimethylammonium, benzyltetradecyldimethylammonium, benzyldodecyldimethylammonium, benzyldecyldimethylammonium, benzyloctyldimethylammonium, benzyltributylammonium, benzyltriethylammonium, tetrabutylammonium, tetrapropylammonium, diisopropyldimethylammonium, tetraethylammonium, and tetramethylammonium.

In some embodiments, the organic cation is alkylphosphonium and is selected from the group consisting of tetraphenylphosphonium, dimethyldiphenylphosphonium, methyltriphenoxyphosphonium, hexadecyltributylphosphonium, octyltributylphosphonium, tetradecyltrihexylphosphonium, tetrakis(hydroxymethyl)phosphonium, tetraoctylphosphonium, tetrabutylphosphonium, and tetramethylphosphonium.

In some embodiments, the nanostructure comprises a core and at least one shell.

In some embodiments, the core comprises Si, Ge, Sn, Se, Te, B, C, P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2OC$, or combinations thereof.

In some embodiments, the core comprises InP.

In some embodiments, the nanostructures comprise two shells.

In some embodiments, at least one shell comprises CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si, or alloys thereof.

In some embodiments, at least one shell comprises ZnSe.
In some embodiments, at least one shell comprises ZnS.
In some embodiments, at least one shell comprises a first shell comprising ZnSe and a second shell comprising ZnS.

In some embodiments, the molar ratio of fluorine atom in the fluoride containing ligand or fluoride anions bound to the nanostructure composition to zinc atom in the nanostructure composition is between about 0.1 and about 0.5. In some embodiments, the molar ratio of fluorine atom in the fluoride containing ligand or fluoride anions bound to the nanostructure composition to zinc atom in the nanostructure composition is about 0.32.

In some embodiments, the method further comprises (d) dispersing the nanostructures of (c) in a non-polar solvent. In some embodiments, the non-polar solvent is selected from the group consisting of hexane, heptane, octane, toluene, and chloroform.

In some embodiments, the admixing in (b) or (b') is at a temperature between about 10° C. and about 100° C.

In some embodiments, the admixing in (c) is at a temperature between about 10° C. and about 100° C.

In some embodiments, the fluoride containing ligand is a salt of tetrafluorozincate or dichlorodifluorozincate.

In some embodiments, the fluoride containing ligand is a tetrabutylammonium tetrafluorozincate or tetrabutylammonium dichlorodifluorozincate.

The present invention also provides a film comprising at least one population of nanostructures, wherein the nanostructures comprise: (a) at least one population of nanostructures, the nanostructures comprising a core and at least one shell; and (b) at least one fluoride containing ligand bound to the surface of the nanostructure; or (b') fluoride anions bound to the surface of the nanostructure. In some embodiments, the fluoride containing ligand is selected from the group consisting of a fluorozincate, tetrafluoroborate, and hexafluorophosphate.

In some embodiments, the film further comprises at least one organic resin.

In some embodiments, the film comprises between one and five populations of nanostructures. In some embodiments, the film comprises one population of nanostructures.

In some embodiments, the at least one population of nanostructures comprises Si, Ge, Sn, Se, Te, B, C, P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2OC$, or combinations thereof.

In some embodiments, the nanostructures comprise a core of InP.

In some embodiments, the nanostructures comprise at least two shells. In some embodiments, the nanostructures comprise two shells.

In some embodiments, at least one shell comprises CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si, or alloys thereof.

In some embodiments, at least one shell comprises ZnSe.
In some embodiments, at least one shell comprises ZnS.
In some embodiments, at least one shell comprises a first shell comprising ZnSe and a second shell comprising ZnS.

In some embodiments, at least one fluoride containing ligand comprises an anion comprising a fluorozincate and a cation comprising a metal ion. In some embodiments, the cation comprises a potassium ion.

In some embodiments, the fluoride containing ligand is a salt of tetrafluorozincate or dichlorodifluorozincate.

In some embodiments, the fluoride containing ligand is a tetrabutylammonium, tetrafluorozincate, or tetrabutylammonium dichlorodifluorozincate.

In some embodiments, at least one fluoride containing ligand comprises an anion comprising a fluorozincate and a cation selected from the group consisting of a tetraalkylammonium, an alkylphosphonium, formamidinium, guanidinium, imidazolium, and pyridinium.

In some embodiments, the cation is tetraalkylammonium and is selected from the group consisting of dioctadecyldimethylammonium, dihexadecyldimethylammonium, ditetradecyldimethylammonium, didodecyldimethylammonium, didecyldimethylammonium, dioctyldimethylammonium, bis(ethylhexyl)dimethylammonium, octadecyltrimethylammonium, oleyltrimethylammonium, hexadecyltrimethylammonium, tetradecyltrimethylammonium, dodecyltrimethylammonium, decyltrimethylammonium, octyltrimethylammonium, phenylethyltrimethylammonium, benzyltrimethylammonium, phenyltrimethylammonium, benzylhexadecyldimethylammonium, benzyltetradecyldimethylammonium, benzyldodecyldimethylammonium, benzyldecyldimethylammonium, benzyloctyldimethylammonium, benzyltributylammonium, benzyltriethylammonium, tetrabutylammonium, tetrapropylammonium, diisopropyldimethylammonium, tetraethylammonium, and tetramethylammonium.

In some embodiments, the cation is alkylphosphonium and is selected from the group consisting of tetraphenylphosphonium, dimethyldiphenylphosphonium, methyltriphenoxyphosphonium, hexadecyltributylphosphonium, octyltributylphosphonium, tetradecyltrihexylphosphonium, tetrakis(hydroxymethyl)phosphonium, tetraoctylphosphonium, tetrabutylphosphonium, and tetramethylphosphonium.

In some embodiments, the molar ratio of fluorine atom in the fluoride containing ligand or fluoride anion bound to the nanostructure composition to zinc atom in the nanostructure composition in the nanostructure film is between about 0.1 and about 0.5. In some embodiments, the molar ratio of fluorine atom in the fluoride containing ligand or fluoride anion bound to the nanostructure composition to zinc atom in the nanostructure composition in the nanostructure film is about 0.32.

In some embodiments, the nanostructures are quantum dots.

In some embodiments, the film comprises between one and five organic resins. In some embodiments, the film comprises one organic resin.

In some embodiments, the at least one organic resin is a thermosetting resin or a UV curable resin. In some embodiments, the at least one organic resin is a UV curable resin.

The present invention also provides a molded article comprising the film according to any one of the embodiments described above.

In some embodiments, the molded article is an electroluminescent device.

In some embodiments, the electroluminescent device is light emitting diode or a liquid crystal display.

In some embodiments, the maximum external quantum efficiency (EQE) of the electroluminescent device is between about 1.5% and about 15%. In some embodiments, the maximum external quantum efficiency (EQE) of the electroluminescent device is about 5%.

In some embodiments, the electroluminescent device reaches 80% of initial luminance after between about 100 seconds and about 700 seconds. In some embodiments, the electroluminescent device reaches 80% of initial luminance after 600 seconds.

In some embodiments, the electroluminescent device reaches 50% of initial luminance after between about 6 hours and about 11 hours. In some embodiments, the electroluminescent device reaches 50% of initial luminance after about 10 hours.

BRIEF DESCRIPTION OF THE DRAWINGS

FIG. 6 is a flow chart showing a ligand exchange procedure from carboxylate-capped nanostructures to fluoride-capped nanostructures. (TBAF:tetrabutylammonium fluoride; OA: oleic acid; $DDA^+$: didodecyldimethylammonium; $TBA^+$: tetrabutylammonium; THF: tetrahydrofuran)

As shown in FIG. 9, the quantum dots after TBAF ligand exchange show improved luminance and efficiency.

DETAILED DESCRIPTION OF THE INVENTION

Definitions

Figure 1:
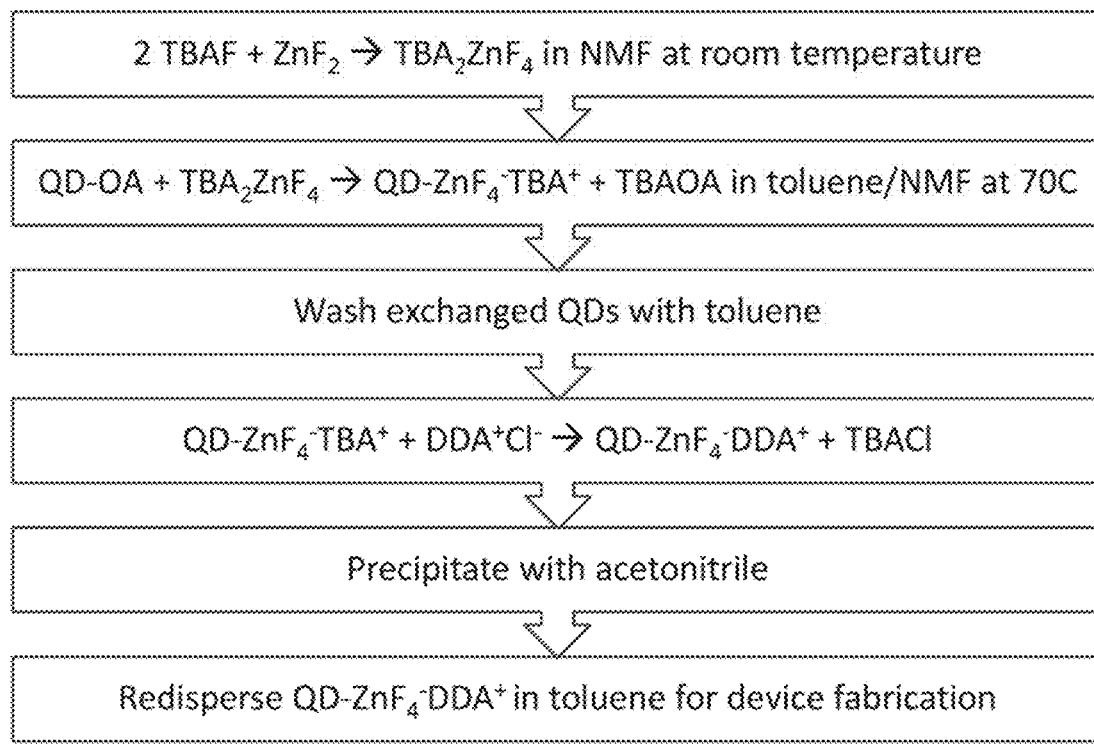
FIG. 1 is a flow chart showing a ligand exchange procedure from carboxylate-capped nanostructures to tetrafluorozincate-capped nanostructures with tetraalkylammonium counterions. (NMF: N-methylformamide; OA: oleic acid; $DDA^+$: didodecyldimethylammonium; $TBA^+$: tetrabutylammonium)

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

The term "about" as used herein indicates the value of a given quantity varies by +/−10% of the value. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogeneous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

As used herein, the term "monolayer" is a measurement unit of shell thickness derived from the bulk crystal structure of the shell material as the closest distance between relevant lattice planes. By way of example, for cubic lattice structures the thickness of one monolayer is determined as the distance between adjacent lattice planes in the [111] direction. By way of example, one monolayer of cubic ZnSe corresponds to 0.328 nm and one monolayer of cubic ZnS corresponds to 0.31 nm thickness. The thickness of a monolayer of alloyed materials can be determined from the alloy composition through Vegard's law.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from transmission electron microscopy (TEM) images of nanocrystals before and after a shell synthesis.

As used herein, the term "layer" refers to material deposited onto the core or onto previously deposited layers and that result from a single act of deposition of the core or shell material. The exact thickness of a layer is dependent on the material. For example, a ZnSe layer may have a thickness of about 0.328 nm and a ZnS layer may have a thickness of about 0.31 nm.

A "ligand" is a molecule capable of interacting (whether weakly or strongly) with one or more faces of a nanostructure, e.g., through covalent, ionic, van der Waals, or other molecular interactions with the surface of the nanostructure.

"Photoluminescence quantum yield" is the ratio of photons emitted to photons absorbed, e.g., by a nanostructure or population of nanostructures. As known in the art, quantum yield is typically determined by a comparative method using well-characterized standard samples with known quantum yield values.

"Peak emission wavelength" (PWL) is the wavelength where the radiometric emission spectrum of the light source reaches its maximum.

As used herein, the term "full width at half-maximum" (FWHM) is a measure of the size distribution of quantum dots. The emission spectra of quantum dots generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the emission wavelength maximum.

As used herein, the term "external quantum efficiency" (EQE) is a ratio of the number of photons emitted from a light emitting diode to the number of electrons passing through the device. The EQE measures how efficiently a light emitting diode converts electrons to photons and allows them to escape. EQE can be measured using the formula:

$$EQE=[\text{injection efficiency}]\times[\text{solid-state quantum yield}]\times[\text{extraction efficiency}]$$

where:
injection efficiency=the proportion of electrons passing through the device that are injected into the active region;
solid-state quantum yield=the proportion of all electron-hole recombinations in the active region that are radiative and thus, produce photons; and
extraction efficiency=the proportion of photons generated in the active region that escape from the device.

As used herein, the term "stable" refers to a mixture or composition that resists change or decomposition due to internal reaction or due to the action of air, heat, light, pressure, other natural conditions, voltage, current, luminance, or other operation conditions. The colloidal stability of a nanostructure composition can be determined by measuring the peak absorption wavelength after admixing at least one population of nanostructures with at least one solvent. The peak absorption wavelength can be measured by irradiating a nanostructure composition with UV or blue (450 nm) light and measuring the output with a spectrometer. The absorption spectrum is compared to the absorption from the original nanostructure composition. A colloid nanostructure composition is stable if the peak absorption wavelength does not shift by more than 5 nm.

Unless clearly indicated otherwise, ranges listed herein are inclusive.

A variety of additional terms are defined or otherwise characterized herein.

As discussed above, a need exists to prepare nanostructure compositions that have a wide electrochemical window or exhibit reversible electrochemistry. Disclosed herein are methods to passivate nanostructures with inorganic ligands. The method includes replacing native organic ligands on quantum dots with inorganic halometallate ligands via a post-synthetic ligand exchange procedure. This results in longer operational lifetime of electroluminescent devices due to improved electrochemical stability of the nanostructure-ligand complexes.

Nanostructure Composition

In some embodiments, the present disclosure provides a nanostructure composition comprising:
(a) at least one population of nanostructures; and
(b) at least one fluoride containing ligand bound to the surface of the nanostructure;
wherein the fluoride containing ligand is selected from the group consisting of a fluorozincate, tetrafluoroborate, and hexafluorophosphate.

In some embodiments, the present disclosure provides a nanostructure composition comprising:
(a) at least one population of nanostructures; and
(b) fluoride anions bound to the surface of the nanostructure.

In some embodiments, the nanostructure comprises a core and at least one shell.

In some embodiments, the nanostructure is a quantum dot.

Nanostructure Film

In some embodiments, the present disclosure provides a nanostructure film comprising at least one population of nanostructures, wherein the nanostructures comprise:
(a) at least one population of nanostructures, the nanostructures comprising a core and at least one shell; and
(b) at least one fluoride containing ligand bound to the surface of the nanostructure;
wherein the fluoride containing ligand is selected from the group consisting of a fluorozincate, tetrafluoroborate, and hexafluorophosphate.

In some embodiments, the present disclosure provides a nanostructure film comprising at least one population of nanostructures, wherein the nanostructures comprise:
(a) at least one population of nanostructures, the nanostructures comprising a core and at least one shell; and
(b) fluoride anions bound to the surface of the nanostructure.

In some embodiments, the nanostructure film further comprising at least one organic resin.

In some embodiments, the nanostructure is a quantum dot.

Nanostructure Molded Article

In some embodiments, the present disclosure provides a molded article comprising the nanostructure film.

In some embodiments, the molded article comprising:
(a) a first barrier layer;
(b) a second barrier layer; and
(c) an emitting layer between the first barrier layer and the second barrier layer, wherein the emitting layer comprises a population of nanostructures comprising at least one population of nanostructures; and at least one fluoride containing ligand bound to the surface of the nanostructure; wherein the fluoride containing ligand is selected from the group consisting of a fluorozincate, tetrafluoroborate, and hexafluorophosphate.

In some embodiments, the molded article comprising:
(a) a first barrier layer;
(b) a second barrier layer; and
(c) an emitting layer between the first barrier layer and the second barrier layer, wherein the emitting layer comprises a population of nanostructures comprising at least one population of nanostructures and fluoride anions bound to the surface of the nanostructure.

In some embodiments, the nanostructure is a quantum dot.

In some embodiments, the molded article is an electroluminescent device. In some embodiments, the molded article is a light emitting diode. In some embodiments, the molded article is a liquid crystal display.

Core Nanostructures

Methods for colloidal synthesis of a variety of nanostructures are known in the art. Such methods include techniques for controlling nanostructure growth, e.g., to control the size and/or shape distribution of the resulting nanostructures.

In a typical colloidal synthesis, semiconductor nanostructures are produced by rapidly injecting precursors that undergo pyrolysis into a hot solution (e.g., hot solvent and/or surfactant). The precursors can be injected simultaneously or sequentially. The precursors rapidly react to form nuclei. Nanostructure growth occurs through monomer addition to the nuclei, typically at a growth temperature that is lower than the injection/nucleation temperature.

Ligands interact with the surface of the nanostructure. At the growth temperature, the ligands rapidly adsorb and desorb from the nanostructure surface, permitting the addition and/or removal of atoms from the nanostructure while suppressing aggregation of the growing nanostructures. In general, a ligand that coordinates weakly to the nanostructure surface permits rapid growth of the nanostructure, while a ligand that binds more strongly to the nanostructure surface results in slower nanostructure growth. The ligand can also interact with one (or more) of the precursors to slow nanostructure growth.

Nanostructure growth in the presence of a single ligand typically results in spherical nanostructures. Using a mixture of two or more ligands, however, permits growth to be controlled such that non-spherical nanostructures can be produced, if, for example, the two (or more) ligands adsorb differently to different crystallographic faces of the growing nanostructure.

A number of parameters are thus known to affect nanostructure growth and can be manipulated, independently or in combination, to control the size and/or shape distribution of the resulting nanostructures. These include, e.g., temperature (nucleation and/or growth), precursor composition, time-dependent precursor concentration, ratio of the precursors to each other, surfactant composition, number of surfactants, and ratio of surfactant(s) to each other and/or to the precursors.

In some embodiments, the nanostructures are free from cadmium. As used herein, the term "free of cadmium" is intended that the nanostructures contain less than 100 ppm by weight of cadmium. The Restriction of Hazardous Substances (RoHS) compliance definition requires that there must be no more than 0.01% (100 ppm) by weight of cadmium in the raw homogeneous precursor materials. The cadmium level in the Cd-free nanostructures of the present invention is limited by the trace metal concentration in the precursor materials. The trace metal (including cadmium) concentration in the precursor materials for the Cd-free nanostructures, can be measured by inductively coupled plasma mass spectroscopy (ICP-MS) analysis, and are on the parts per billion (ppb) level. In some embodiments, nanostructures that are "free of cadmium" contain less than about 50 ppm, less than about 20 ppm, less than about 10 ppm, or less than about 1 ppm of cadmium.

In some embodiments, the core comprises Si, Ge, Sn, Se, Te, B, C, P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2OC$, or combinations thereof.

In some embodiments, the core is a Group III-V nanostructure. In some embodiments, the core is a Group III-V nanocrystal selected from the group consisting of BN, BP, BAs, BSb, AlN, AlP, AlAs, AlSb, GaN, GaP, GaAs, GaSb, InN, InP, InAs, and InSb. In some embodiments, the core is an InP nanocrystal.

The synthesis of Group III-V nanostructures has been described in U.S. Pat. Nos. 5,505,928, 6,306,736, 6,576,291, 6,788,453, 6,821,337, 7,138,098, 7,557,028, 8,062,967, 7,645,397, and 8,282,412 and in U.S. Patent Appl. Publication No. 2015/236195. Synthesis of Group III-V nanostructures has also been described in Wells, R. L., et al., "The use of tris(trimethylsilyl)arsine to prepare gallium arsenide and indium arsenide," *Chem. Mater.* 1:4-6 (1989) and in Guzelian, A. A., et al., "Colloidal chemical synthesis and characterization of InAs nanocrystal quantum dots," *Appl. Phys. Lett.* 69: 1432-1434 (1996).

Synthesis of InP-based nanostructures has been described, e.g., in Xie, R., et al., "Colloidal InP nanocrystals as efficient emitters covering blue to near-infrared," J. Am. Chem. Soc. 129:15432-15433 (2007); Micic, O. I., et al., "Core-shell quantum dots of lattice-matched $ZnCdSe_2$ shells on InP cores: Experiment and theory," J. Phys. Chem. B 104: 12149-12156 (2000); Liu, Z., et al., "Coreduction colloidal synthesis of III-V nanocrystals: The case of InP," *Angew. Chem. Int. Ed. Engl.* 47:3540-3542 (2008); Li, L. et al., "Economic synthesis of high quality InP nanocrystals using calcium phosphide as the phosphorus precursor," *Chem. Mater.* 20:2621-2623 (2008); D. Battaglia and X. Peng, "Formation of high quality InP and InAs nanocrystals in a noncoordinating solvent," *Nano Letters* 2:1027-1030 (2002); Kim, S., et al., "Highly luminescent InP/GaP/ZnS nanocrystals and their application to white light-emitting diodes," *J. Am. Chem. Soc.* 134:3804-3809 (2012); Nann, T., et al., "Water splitting by visible light: A nanophotocathode for hydrogen production," *Angew. Chem. Int. Ed.* 49:1574-1577 (2010); Borchert, H., et al., "Investigation of ZnS passivated InP nanocrystals by XPS," *Nano Letters* 2:151-154 (2002); L. Li and P. Reiss, "One-pot synthesis of highly luminescent InP/ZnS nanocrystals without precursor injection," *J. Am. Chem. Soc.* 130:11588-11589 (2008); Hussain, S., et al. "One-pot fabrication of high-quality InP/ZnS (core/shell) quantum dots and their application to cellular imaging," *Chemphyschem.* 10:1466-1470 (2009); Xu, S., et al., "Rapid synthesis of high-quality InP nanocrystals," *J. Am. Chem. Soc.* 128:1054-1055 (2006); Micic, O. I., et al., "Size-dependent spectroscopy of InP quantum dots," *J. Phys. Chem. B* 101:4904-4912 (1997); Haubold, S., et al., "Strongly luminescent InP/ZnS core-shell nanoparticles," *Chemphyschem.* 5:331-334 (2001); CrosGagneux, A., et al., "Surface chemistry of InP quantum dots: A comprehensive study," *J. Am. Chem. Soc.* 132:18147-18157 (2010); Micic, O. I., et al., "Synthesis and characterization of InP, GaP, and $GaInP_2$ quantum dots," *J. Phys. Chem.* 99:7754-7759 (1995); Guzelian, A. A., et al., "Synthesis of size-selected, surface-passivated InP nanocrystals," *J. Phys. Chem.* 100: 7212-7219 (1996); Lucey, D. W., et al., "Monodispersed InP quantum dots prepared by colloidal chemistry in a non-coordinating solvent," *Chem. Mater.* 17:3754-3762 (2005); Lim, J., et al., "InP@ZnSeS, core@composition gradient shell quantum dots with enhanced stability," *Chem. Mater.* 23:4459-4463 (2011); and Zan, F., et al., "Experimental studies on blinking behavior of single InP/ZnS quantum dots: Effects of synthetic conditions and UV irradiation," *J. Phys. Chem. C* 116:394-3950 (2012). However, such efforts have had only limited success in producing InP nanostructures with high quantum yields.

In some embodiments, the core is doped. In some embodiments, the dopant of the nanocrystal core comprises a metal, including one or more transition metals. In some embodiments, the dopant is a transition metal selected from the group consisting of Ti, Zr, Hf, V, Nb, Ta, Cr, Mo, W, Mn, Tc, Re, Fe, Ru, Os, Co, Rh, Ir, Ni, Pd, Pt, Cu, Ag, Au, and combinations thereof. In some embodiments, the dopant comprises a non-metal. In some embodiments, the dopant is ZnS, ZnSe, ZnTe, CdSe, CdS, CdTe, HgS, HgSe, HgTe, $CuInS_2$, $CuInSe_2$, AlN, AlP, AlAs, GaN, GaP, or GaAs.

In some embodiments, the core is a Group II-VI nanocrystal selected from the group consisting of ZnO, ZnSe, ZnS, ZnTe, CdO, CdSe, CdS, CdTe, HgO, HgSe, HgS, and HgTe. In some embodiments, the core is a nanocrystal selected from the group consisting of ZnSe, ZnS, CdSe, and CdS. The synthesis of Group II-VI nanostructures has been described in U.S. Pat. Nos. 6,225,198, 6,322,901, 6,207,229, 6,607,829, 7,060,243, 7,374,824, 6,861,155, 7,125,605, 7,566,476, 8,158,193, and 8,101,234 and in U.S. Patent Appl. Publication Nos. 2011/0262752 and 2011/0263062.

Although Group II-VI nanostructures such as CdSe and CdS quantum dots can exhibit desirable luminescence behavior, issues such as the toxicity of cadmium limit the applications for which such nanostructures can be used. Less toxic alternatives with favorable luminescence properties are thus highly desirable. Group III-V nanostructures in general and InP-based nanostructures in particular, offer the best-known substitute for cadmium-based materials due to their compatible emission range.

In some embodiments, the core is purified before deposition of a shell. In some embodiments, the core is filtered to remove precipitate from the core solution.

In some embodiments, the core is subjected to an acid etching step before deposition of a shell.

In some embodiments, the diameter of the core is determined using quantum confinement. Quantum confinement in zero-dimensional nanocrystallites, such as quantum dots, arises from the spatial confinement of electrons within the crystallite boundary. Quantum confinement can be observed once the diameter of the material is of the same magnitude as the de Broglie wavelength of the wave function. The electronic and optical properties of nanoparticles deviate substantially from those of bulk materials. A particle behaves as if it were free when the confining dimension is large compared to the wavelength of the particle. During this state, the band gap remains at its original energy due to a continuous energy state. However, as the confining dimension decreases and reaches a certain limit, typically in nanoscale, the energy spectrum becomes discrete. As a result, the band gap becomes size-dependent. Size can be determined as is known in the art, for example, using transmission electron microscopy and/or physical modeling. In some embodiments, the diameter of the core nanostructures is between about 1 nm and about 9 nm, between about 1 nm and about 8 nm, between about 1 nm and about 7 nm, between about 1 nm and about 6 nm, between about 1 nm and about 5 nm, between about 1 nm and about 4 nm, between about 1 nm and about 3 nm, between about 1 nm and about 2 nm, between about 2 nm and about 9 nm, between about 2 nm and about 8 nm, between about 2 nm and about 7 nm, between about 2 nm and about 6 nm, between about 2 nm and about 5 nm, between about 2 nm and about 4 nm, between about 2 nm and about 3 nm, between about 3 nm and about 9 nm, between about 3 nm and about 8 nm, between about 3 nm and about 7 nm, between about 3 nm and about 6 nm, between about 3 nm and about 5 nm, between about 3 nm and about 4 nm, between about 4 nm and about 9 nm, between about 4 nm and about 8 nm, between about 4 nm and about 7 nm, between about 4 nm and about 6 nm, between about 4 nm and about 5 nm, between about 5 nm and about 9 nm, between about 5 nm and about 8 nm, between about 5 nm and about 7 nm, between about 5 nm and about 6 nm, between about 6 nm and about 9 nm, between about 6 nm and about 8 nm, between about 6 nm and about 7 nm, between about 7 nm and about 9 nm, between about 7 nm and about 8 nm, or between about 8 nm and about 9 nm. In some embodiments, the diameter of the core nanostructures is about 7 nm.

Shell Layers

In some embodiments, the nanostructures of the present disclosure comprise a core and at least one shell. In some embodiments, the nanostructures comprise a core and at least two shells. In some embodiments, the nanostructure comprises a core and two shells.

The shell can, e.g., increase the quantum yield and/or stability of the nanostructures. In some embodiments, the core and the shell comprise different materials. In some embodiments, the nanostructure comprises shells of different shell material.

In some embodiments, a shell that comprises a mixture of Group II and VI elements is deposited onto a core or a core/shell(s) structure. In some embodiments, the shell is deposited by a mixture of at least two of a zinc source, a selenium source, a sulfur source, a tellurium source, and a cadmium source. In some embodiments, the shell is deposited by a mixture of two of a zinc source, a selenium source, a sulfur source, a tellurium source, and a cadmium source. In some embodiments, the shell is deposited by a mixture of three of a zinc source, a selenium source, a sulfur source, a tellurium source, and a cadmium source. In some embodiments, the shell is composed of zinc and sulfur; zinc and selenium; zinc, sulfur, and selenium; zinc and tellurium; zinc, tellurium, and sulfur; zinc, tellurium, and selenium; zinc, cadmium, and sulfur; zinc, cadmium, and selenium; cadmium and sulfur; cadmium and selenium; cadmium, selenium, and sulfur; cadmium, zinc, and sulfur; cadmium, zinc, and selenium; or cadmium, zinc, sulfur, and selenium.

In some embodiments, the at least one shell comprises CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si, or alloys thereof. In some embodiments, the at least one shell comprises ZnSe. In some embodiments, the at least one shell comprises ZnS. In some embodiments, the at least one shell comprises a first shell comprising ZnSe and a second shell comprising ZnS.

In some embodiments, a shell comprises more than one monolayer of shell material. The number of monolayers is an average for all the nanostructures; therefore, the number of monolayers in a shell can be a fraction. In some embodiments, the number of monolayers in a shell is between 0.25 and 10, between 0.25 and 8, between 0.25 and 7, between 0.25 and 6, between 0.25 and 5, between 0.25 and 4, between 0.25 and 3, between 0.25 and 2, between 2 and 10, between 2 and 8, between 2 and 7, between 2 and 6, between 2 and 5, between 2 and 4, between 2 and 3, between 3 and 10, between 3 and 8, between 3 and 7, between 3 and 6, between 3 and 5, between 3 and 4, between 4 and 10, between 4 and 8, between 4 and 7, between 4 and 6, between 4 and 5, between 5 and 10, between 5 and 8, between 5 and 7, between 5 and 6, between 6 and 10, between 6 and 8, between 6 and 7, between 7 and 10, between 7 and 8, or between 8 and 10. In some embodiments, the shell comprises between 3 and 5 monolayers.

The thickness of the shell can be controlled by varying the amount of precursor provided. For a given shell thickness, at least one of the precursors is optionally provided in an amount whereby, when a growth reaction is substantially complete, a shell of a predetermined thickness is obtained. If more than one different precursor is provided, either the amount of each precursor can be limited or one of the precursors can be provided in a limiting amount while the others are provided in excess.

The thickness of each shell can be determined using techniques known to those of skill in the art. In some embodiments, the thickness of each shell is determined by comparing the average diameter of the nanostructure before and after the addition of each shell. In some embodiments, the average diameter of the nanostructure before and after the addition of each shell is determined by TEM. In some embodiments, each shell has a thickness of between about 0.05 nm and about 3.5 nm, between about 0.05 nm and about 2 nm, between about 0.05 nm and about 0.9 nm, between about 0.05 nm and about 0.7 nm, between about 0.05 nm and about 0.5 nm, between about 0.05 nm and about 0.3 nm, between about 0.05 nm and about 0.1 nm, between about 0.1 nm and about 3.5 nm, between about 0.1 nm and about 2 nm, between about 0.1 nm and about 0.9 nm, between about 0.1 nm and about 0.7 nm, between about 0.1 nm and about 0.5 nm, between about 0.1 nm and about 0.3 nm, between about 0.3 nm and about 3.5 nm, between about 0.3 nm and about 2 nm, between about 0.3 nm and about 0.9 nm, between about 0.3 nm and about 0.7 nm, between about 0.3 nm and about 0.5 nm, between about 0.5 nm and about 3.5 nm, between about 0.5 nm and about 2 nm, between about 0.5 nm and about 0.9 nm, between about 0.5 nm and about 0.7 nm, between about 0.7 nm and about 3.5 nm, between about 0.7 nm and about 2 nm, between about 0.7 nm and about 0.9 nm, between about 0.9 nm and about 3.5 nm, between about 0.9 nm and about 2 nm, or between about 2 nm and about 3.5 nm.

In some embodiments, each shell is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Application Publication No. 2008/0118755.

Ligands suitable for the synthesis of a shell are known by those of skill in the art. In some embodiments, the ligand is a fatty acid selected from the group consisting of lauric acid, caproic acid, myristic acid, palmitic acid, stearic acid, and oleic acid. In some embodiments, the ligand is an organic phosphine or an organic phosphine oxide selected from trioctylphosphine oxide, trioctylphosphine, diphenylphosphine, triphenylphosphine oxide, and tributylphosphine oxide. In some embodiments, the ligand is an amine selected from the group consisting of dodecylamine, oleylamine, hexadecylamine, dioctylamine, and octadecylamine. In some embodiments, the ligand is tributylphosphine, oleic acid, or zinc oleate.

In some embodiments, each shell is produced in the presence of a mixture of ligands. In some embodiments, each shell is produced in the presence of a mixture comprising 2, 3, 4, 5, or 6 different ligands. In some embodiments, each shell is produced in the presence of a mixture comprising 3 different ligands. In some embodiments, the mixture of ligands comprises tributylphosphine, oleic acid, and zinc oleate.

In some embodiments, each shell is produced in the presence of a solvent. In some embodiments, the solvent is selected from the group consisting of 1-octadecene, 1-hexadecene, 1-eicosene, eicosane, octadecane, hexadecane, tetradecane, squalene, squalane, trioctylphosphine oxide, and dioctyl ether. In some embodiments, the solvent is 1-octadecene.

In some embodiments, a core or a core/shell(s) and shell precursor are contacted at an addition temperature between about 20° C. and about 310° C., between about 20° C. and about 280° C., between about 20° C. and about 250° C., between about 20° C. and about 200° C., between about 20° C. and about 150° C., between about 20° C. and about 100° C., between about 20° C. and about 50° C., between about 50° C. and about 310° C., between about 50° C. and about 280° C., between about 50° C. and about 250° C., between about 50° C. and about 200° C., between about 50° C. and about 150° C., between about 50° C. and about 100° C., between about 100° C. and about 310° C., between about 100° C. and about 280° C., between about 100° C. and about 250° C., between about 100° C. and about 200° C., between about 100° C. and about 150° C., between about 150° C. and about 310° C., between about 150° C. and about 280° C., between about 150° C. and about 250° C., between about 150° C. and about 200° C., between about 200° C. and about 310° C., between about 200° C. and about 280° C., between about 200° C. and about 250° C., between about 250° C. and about 310° C., between about 250° C. and about 280° C., or between about 280° C. and about 310° C. In some embodiments, a core or a core/shell(s) and shell precursor are contacted at an addition temperature between about 20° C. and about 100° C.

In some embodiments, after contacting a core or core/shell(s) and shell precursor, the temperature of the reaction mixture is increased to an elevated temperature between about 200° C. and about 310° C., between about 200° C. and about 280° C., between about 200° C. and about 250° C., between about 200° C. and about 220° C., between about 220° C. and about 310° C., between about 220° C. and about 280° C., between about 220° C. and about 250° C., between about 250° C. and about 310° C., between about 250° C. and about 280° C., or between about 280° C. and about 310° C. In some embodiments, after contacting a core or core/shell(s) and shell precursor, the temperature of the reaction mixture is increased to between about 250° C. and about 310° C.

In some embodiments, after contacting a core or core/shell(s) and shell precursor, the time for the temperature to reach the elevated temperature is between about 2 and about 240 minutes, between about 2 and about 200 minutes, between about 2 and about 100 minutes, between about 2 and about 60 minutes, between about 2 and about 40 minutes, between about 5 and about 240 minutes, between about 5 and about 200 minutes, between about 5 and about 100 minutes, between about 5 and about 60 minutes, between about 5 and about 40 minutes, between about 10 and about 240 minutes, between about 10 and about 200 minutes, between about 10 and about 100 minutes, between about 10 and about 60 minutes, between about 10 and about 40 minutes, between about 40 and about 240 minutes, between about 40 and about 200 minutes, between about 40 and about 100 minutes, between about 40 and about 60 minutes, between about 60 and about 240 minutes, between about 60 and about 200 minutes, between about 60 and about 100 minutes, between about 100 and about 240 minutes, between about 100 and about 200 minutes, or between about 200 and about 240 minutes.

In some embodiments, after contacting a core or core/shell(s) and shell precursor, the temperature of the reaction mixture is maintained at an elevated temperature for between about 2 and about 240 minutes, between about 2 and about 200 minutes, between about 2 and about 100 minutes, between about 2 and about 60 minutes, between about 2 and about 40 minutes, between about 5 and about 240 minutes, between about 5 and about 200 minutes, between about 5 and about 100 minutes, between about 5 and about 60 minutes, between about 5 and about 40 minutes, between about 10 and about 240 minutes, between about 10 and about 200 minutes, between about 10 and about 100 minutes, between about 10 and about 60 minutes, between about 10 and about 40 minutes, between about 40 and about 240 minutes, between about 40 and about 200 minutes, between about 40 and about 100 minutes, between about 40 and about 60 minutes, between about 60 and about 240 minutes, between about 60 and about 200 minutes, between about 60 and about 100 minutes, between about 100 and about 240 minutes, between about 100 and about 200 minutes, or between about 200 and about 240 minutes. In some embodiments, after contacting a core or core/shell(s) and shell precursor, the temperature of the reaction mixture is maintained at an elevated temperature for between about 30 and about 120 minutes.

In some embodiments, additional shells are produced by further additions of shell material precursors that are added to the reaction mixture followed by maintaining at an elevated temperature. Typically, additional shell precursor is provided after reaction of the previous shell is substantially complete (e.g., when at least one of the previous precursors is depleted or removed from the reaction or when no additional growth is detectable). The further additions of precursor create additional shells.

In some embodiments, the nanostructure is cooled before the addition of additional shell material precursor to provide further shells. In some embodiments, the nanostructure is maintained at an elevated temperature before the addition of shell material precursor to provide further shells.

After sufficient layers of shell have been added for the nanostructure to reach the desired thickness and diameter, the nanostructure can be cooled. In some embodiments, the core/shell(s) nanostructures are cooled to room temperature. In some embodiments, an organic solvent is added to dilute the reaction mixture comprising the core/shell(s) nanostructures.

In some embodiments, the organic solvent used to dilute the reaction mixture is ethanol, hexane, pentane, toluene, benzene, diethylether, acetone, ethyl acetate, dichloromethane(methylene chloride), chloroform, dimethylformamide, or N-methylpyrrolidinone. In some embodiments, the organic solvent is toluene.

In some embodiments, core/shell(s) nanostructures are isolated. In some embodiments, the core/shell(s) nanostructures are isolated by precipitation using an organic solvent. In some embodiments, the core/shell(s) nanostructures are isolated by flocculation with ethanol.

The number of monolayers will determine the size of the core/shell(s) nanostructures. The size of the core/shell(s) nanostructures can be determined using techniques known to those of skill in the art. In some embodiments, the size of the core/shell(s) nanostructures is determined using TEM. In some embodiments, the core/shell(s) nanostructures have an average diameter of between about 1 nm and about 15 nm, between about 1 nm and about 10 nm, between about 1 nm and about 9 nm, between about 1 nm and about 8 nm, between about 1 nm and about 7 nm, between about 1 nm and about 6 nm, between about 1 nm and about 5 nm, between about 5 nm and about 15 nm, between about 5 nm and about 10 nm, between about 5 nm and about 9 nm, between about 5 nm and about 8 nm, between about 5 nm and about 7 nm, between about 5 nm and about 6 nm, between about 6 nm and about 15 nm, between about 6 nm and about 10 nm, between about 6 nm and about 9 nm, between about 6 nm and about 8 nm, between about 6 nm and about 7 nm, between about 7 nm and about 15 nm, between about 7 nm and about 10 nm, between about 7 nm and about 9 nm, between about 7 nm and about 8 nm, between about 8 nm and about 15 nm, between about 8 nm and about 10 nm, between about 8 nm and about 9 nm, between about 9 nm and about 15 nm, between about 9 nm and about 10 nm, or between about 10 nm and about 15 nm. In some embodiments, the core/shell(s) nanostructures have an average diameter of between about 6 nm and about 7 nm.

Nanostructure Composition

In some embodiments, the present disclosure provides a nanostructure composition comprising:

(a) at least one population of nanostructures; and (b) at least one fluoride containing ligand bound to the surface of the nanostructure; or (b') fluoride anions bound to the surface of the nanostructure;

wherein the fluoride containing ligand is selected from the group consisting of a fluorozincate, tetrafluoroborate, and hexafluorophosphate.

In some embodiments, the nanostructure comprises a core and at least one shell.

In some embodiments, the core comprises Si, Ge, Sn, Se, Te, B, C, P, BN, BP, BAs, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2OC$, or combinations thereof. In some embodiments, the core comprises InP.

In some embodiments, the nanostructure comprises two shells.

In some embodiments, the at least one shell comprises CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AN, AlSb, AlS, PbS, PbO, PbSe, PbTe, MgO, MgS, MgSe, MgTe, CuCl, Ge, Si, or alloys thereof. In some embodiments, the at least one shell comprises ZnSe. In some embodiments, the at least one shell comprises ZnS. In some embodiments, the at least one shell comprises a first shell comprising ZnSe and a second shell comprising ZnS.

In some embodiments, the core/shell(s) nanostructure is prepared using the method of U.S. Application Publication No. 2017/0306227, which is incorporated by reference in its entirety.

In some embodiments, the core/shell(s) nanostructure is a core/ZnSe/ZnS nanostructure. In some embodiments, the core/shell(s) nanostructure is an InP/ZnSe/ZnS nanostructure. In some embodiments, the core/shell(s) nanostructure comprise a core comprising InP, at least one shell comprising ZnSe, at least one shell comprising ZnS, and at least one fluoride containing ligand comprising tetrafluorozincate or dichlorodifluorozincate.

In some embodiments, the nanostructure is a quantum dot.

Fluoride Containing Ligand

In some embodiments, the nanostructure composition comprises at least one fluoride containing ligand bound to the surface of the nanostructure. In some embodiments, the nanostructure composition comprises one fluoride containing ligand bound to the surface of the nanostructure. In some embodiments, the fluoride containing ligand is an inorganic ligand.

In some embodiments, the at least one fluoride containing ligand comprises an anion comprising a fluorozincate and an inorganic cation. In some embodiments, the inorganic cation comprises a metal ion. In some embodiments, the cation comprises a potassium ion.

In some embodiments, the at least one fluoride containing ligand comprises an anion comprising a fluorozincate and an organic cation. In some embodiments, the organic cation is selected from the group consisting of a tetraalkylammonium, an alkylphosphonium, imidazolium, formamidinium, guanidinium, and pyridinium. In some embodiments, the organic cation is tetraalkylammonium and is selected from the group consisting of dioctadecyldimethylammonium, dihexadecyldimethylammonium, ditetradecyldimethylammonium, didodecyldimethylammonium, didecyldimethylammonium, dioctyldimethylammonium, bis(ethylhexyl)dimethylammonium, octadecyltrimethylammonium, oleyltrimethylammonium, hexadecyltrimethylammonium, tetradecyltrimethylammonium, dodecyltrimethylammonium, decyltrimethylammonium, octyltrimethylammonium, phenylethyltrimethylammonium, benzyltrimethylammonium, phenyltrimethylammonium, benzylhexadecyldimethylammonium, benzyltetradecyldimethylammonium, benzyldodecyldimethylammonium, benzyldecyldimethylammonium, benzyloctyldimethylammonium, benzyltributylammonium, benzyltriethylammonium, tetrabutylammonium, tetrapropylammonium, diisopropyldimethylammonium, tetraethylammonium, and tetramethylammonium. In some embodiments, the organic cation is alkylphosphonium and is selected from the group consisting of tetraphenylphosphonium, dimethyldiphenylphosphonium, methyltriphenoxyphosphonium, hexadecyltributylphosphonium, octyltributylphosphonium, tetradecyltrihexylphosphonium, tetrakis(hydroxymethyl) phosphonium, tetraoctylphosphonium, tetrabutylphosphonium, and tetramethylphosphonium. In some embodiments, the fluoride containing ligand is a salt of tetrafluorozincate or dichlorodifluorozincate. In some embodiments, the fluoride containing ligand is a tetrabutylammonium tetrafluorozincate or tetrabutylammonium dichlorodifluorozincate.

The concentration of fluoride containing ligand in the nanostructure composition can be determined by optical density (OD) measurement. OD can be measured at 450 nm using a 1 cm path length cuvette. For a 100 μL nanostructure composition with an $OD_{450}$=1.5, the concentration of the fluoride containing ligand is between about 0.01 mM and about 40 mM, about 0.01 mM and about 20 mM, about 0.01 mM and about 10 mM, about 0.01 mM and about 5 mM, about 0.01 mM and about 2.5 mM, about 0.01 mM and about 1.5 mM, about 0.01 mM and about 1 mM, about 0.01 mM and about 0.5 mM, about 0.01 mM and about 0.25 mM, about 0.25 mM and about 40 mM, about 0.25 mM and about 20 mM, about 0.25 mM and about 10 mM, about 0.25 mM and about 5 mM, about 0.25 mM and about 2.5 mM, about 0.25 mM and about 1.5 mM, about 0.25 mM and about 1.5 mM, about 0.25 mM and about 1 mM, about 0.25 mM and about 0.5 mM, about 0.25 mM and about 0.5 mM, about 0.5 mM and about 40 mM, about 0.5 mM and about 20 mM, about 0.5 mM and about 10 mM, about 0.5 mM and about 5 mM, about 0.5 mM and about 2.5 mM, about 0.5 mM and about 1.5 mM, about 0.5 mM and about 1 mM, about mM and about 40 mM, about 1 mM and about 20 mM, about 1 mM and about 10 mM, about 1 mM and about 5 mM, about 1 mM and about 2.5 mM, about 1 mM and about 1.5 mM, about 1.5 mM and about 40 mM, about 1.5 mM and about 20 mM, about 1.5 mM and about 10 mM, about 1.5 mM and about 5 mM, about 1.5 mM and about 2.5 mM, about 2.5 mM and about 40 mM, about 2.5 mM and about 20 mM, about 2.5 mM and about 10 mM, about 2.5 mM and about 5 mM, about 5 mM and about 40 mM, about 5 mM and about 20 mM, about 5 mM and about 10 mM, about 10 mM and about 40 mM, about 10 mM and about 20 mM, or about 20 mM and about 40 mM. In some embodiments, for a 100 μL nanostructure composition with an $OD_{450}$=1.5, the concentration of the fluoride containing ligand is between about 1 mM and about 12 mM. In some embodiments, for a 100 μL nanostructure composition with an $OD_{450}$=1.5, the concentration of the fluoride containing ligand is about 6 mM.

In some embodiments, the molar ratio of fluorine atom in the fluoride containing ligand bound to the nanostructure composition to zinc atom in the nanostructure composition is between about 0.1 and about 0.5, between about 0.1 and about 0.4, between about 0.1 and about 0.3, between about 0.1 and about 0.2, between about 0.2 and about 0.5, between about 0.2 and about 0.4, between about 0.2 and about 0.3, between about 0.3 and about 0.5, between about 0.3 and about 0.4, or between about 0.4 and about 0.5. In some embodiments, the molar ratio of fluorine atom in the fluoride containing ligand bound to the nanostructure composition to zinc atom in the nanostructure composition is about 0.32.

Solvents and Surfactants

In some embodiments, the nanostructure composition further comprises a solvent.

In some embodiments, the solvent is selected from the group consisting of hexane, heptane, octane, toluene, chloroform, N-methylformamide, butanone, ethylene glycol monoethyl ether, ethylene glycol monopropyl ether, 1,4-butanediol diacetate, diethylene glycol monobutyl ether acetate, ethylene glycol monobutyl ether acetate, glyceryl triacetate, heptyl acetate, hexyl acetate, pentyl acetate, butyl acetate, ethyl acetate, diethylene glycol butyl methyl ether, diethylene glycol monobutyl ether, di(propylene glycol) dimethyl ether, diethylene glycol ethyl methyl ether, ethylene glycol monobutyl ether, diethylene glycol diethyl ether, methyl ethyl ketone, methyl isobutyl ketone, monomethyl ether glycol ester, gamma-butyrolactone, methylacetic-3-ethyl ether, butyl carbitol, butyl carbitol acetate, propanediol monomethyl ether, propanediol monomethyl ether acetate, cyclohexane, toluene, xylene, isopropyl alcohol, and combinations thereof. In some embodiments, the solvent is selected from the group consisting of hexane, heptane, octane, toluene, chloroform, and N-methylformamide.

In some embodiments, the solvent is a non-polar solvent.

In some embodiments, the nanostructure composition further comprises a surfactant.

In some embodiments, the surfactant is selected from the group consisting of tetrabutylammonium bromide, tetraethylammonium acetate, dioctadecyldimethylammonium bromide, dihexadecyldimethylammonium bromide, ditetradecyldimethylammonium bromide, didodecyldimethylammonium bromide, didecyldimethylammonium bromide, dioctyldimethylammonium bromide, bis(ethylhexyl)dimethylammonium bromide, octadecyltrimethylammonium bromide, oleyltrimethylammonium bromide, hexadecyltrimethylammonium bromide, tetradecyltrimethylammonium bromide, dodecyltrimethylammonium bromide, decyltrimethylammonium bromide, octyltrimethylammonium bromide, phenylethyltrimethylammonium bromide, benzyltrimethylammonium bromide, phenyltrimethylammonium bromide, benzylhexadecyldimethylammonium bromide, benzyltetradecyldimethylammonium bromide, benzyldodecyldimethylammonium bromide, benzyldecyldimethylammonium bromide, benzyloctyldimethylammonium bromide, benzyltributylammonium bromide, benzyltriethylammonium bromide, tetrabutylammonium bromide, tetrapropylammonium bromide, diisopropyldimethylammonium bromide, tetraethylammonium bromide, tetramethylammonium bromide, tetraphenylphosphonium bromide, dimethyldiphenylphosphonium bromide, methyltriphenoxyphosphonium bromide, hexadecyltributylphosphonium bromide, octyltributylphosphonium bromide, tetradecyltrihexylphosphonium bromide, tetrakis(hydroxymethyl)phosphonium bromide, tetraoctylphosphonium bromide, tetrabutylphosphonium bromide, tetramethylphosphonium bromide, dodecylammonium bromide, dioctadecyldimethylammonium chloride, dihexadecyldimethylammonium chloride, ditetradecyldimethylammonium chloride, didodecyldimethylammonium chloride, didecyldimethylammonium chloride, dioctyldimethylammonium chloride, bis(ethylhexyl)dimethylammonium chloride, octadecyltrimethylammonium chloride, oleyltrimethylammonium chloride, hexadecyltrimethylammonium chloride, tetradecyltrimethylammonium chloride, dodecyltrimethylammonium chloride, decyltrimethylammonium chloride, octyltrimethylammonium chloride, phenylethyltrimethylammonium chloride, benzyltrimethylammonium chloride, phenyltrimethylammonium chloride, benzylhexadecyldimethylammonium chloride, benzyltetradecyldimethylammonium chloride, benzyldodecyldimethylammonium chloride, benzyldecyldimethylammonium chloride, benzyloctyldimethylammonium chloride, benzyltributylammonium chloride, benzyltriethylammonium chloride, tetrabutylammonium chloride, tetrapropylammonium chloride, diisopropyldimethylammonium chloride, tetraethylammonium chloride, tetramethylammonium chloride, tetraphenylphosphonium chloride, dimethyldiphenylphosphonium chloride, methyltriphenoxyphosphonium chloride, hexadecyltributylphosphonium chloride, octyltributylphosphonium chloride, tetradecyltrihexylphosphonium chloride, tetrakis(hydroxymethyl)phosphonium chloride, tetraoctylphosphonium chloride, tetrabutylphosphonium chloride, tetramethylphosphonium chloride, and dodecylammonium chloride.

Method of Preparing a Nanostructure Composition and Ligand Exchange

In some embodiments, the present disclosure is directed to a ligand exchange method of replacing a first ligand on a nanostructure with a second ligand.

In some embodiments, the first ligand is a fatty acid selected from the group consisting of lauric acid, caproic acid, myristic acid, palmitic acid, stearic acid, and oleic acid. In some embodiments, the first ligand is an organic phosphine or an organic phosphine oxide selected from trioctylphosphine oxide, trioctylphosphine, diphenylphosphine, triphenylphosphine oxide, and tributylphosphine oxide. In some embodiments, the first ligand is an amine selected from the group consisting of dodecylamine, oleylamine, hexadecylamine, dioctylamine, and octadecylamine. In some embodiments, the first ligand is tributylphosphine, oleic acid, or zinc oleate.

In some embodiments, the second ligand is a fluoride containing ligand. In some embodiments, the fluoride containing ligand comprises an anion comprising a fluorozincate and an inorganic cation. In some embodiments, the inorganic cation comprises a metal ion. In some embodiments, the cation comprises a potassium ion. In some embodiments, the fluoride containing ligand comprises an anion comprising a fluorozincate and an organic cation. In some embodiments, the organic cation is selected from the group consisting of a tetraalkylammonium, an alkylphosphonium, formamidinium, guanidinium, imidazolium, and pyridinium. In some embodiments, the organic cation is tetraalkylammonium and is selected from the group consisting of dioctadecyldimethylammonium, dihexadecyldimethylammonium, ditetradecyldimethylammonium, didodecyldimethylammonium, didecyldimethylammonium, dioctyldimethylammonium, bis(ethylhexyl)dimethylammonium, octadecyltrimethylammonium, oleyltrimethylammonium, hexadecyltrimethylammonium, tetradecyltrimethylammonium, dodecyltrimethylammonium, decyltrimethylammonium, octyltrimethylammonium, phenylethyltrimethylammonium, benzyltrimethylammonium, phenyltrimethylammonium, benzylhexadecyldimethylammonium, benzyltetradecyldimethylammonium, benzyldodecyldimethylammonium, benzyldecyldimethylammonium, benzyloctyldimethylammonium, benzyltributylammonium, benzyltriethylammonium, tetrabutylammonium, tetrapropylammonium, diisopropyldimethylammonium, tetraethylammonium, and tetramethylammonium. In some embodiments, the organic cation is alkylphosphonium and is selected from the group consisting of tetraphenylphosphonium, dimethyldiphenylphosphonium, methyltriphenoxyphosphonium, hexadecyltributylphosphonium, octyltributylphosphonium, tetradecyltrihexylphosphonium, tetrakis(hydroxymethyl)phosphonium, tetraoctylphosphonium, tetrabutylphosphonium, and tetramethylphosphonium. In some embodiments, the fluoride containing ligand is a salt of tetrafluorozincate or dichlorodifluorozincate. In some embodiments, the fluoride containing ligand is a tetrabutylammonium tetrafluorozincate or tetrabutylammonium dichlorodifluorozincate.

In some embodiments, the second ligand is a fluoride anion.

In some embodiments, the molar ratio of the first ligand to the fluoride containing ligand is between about 1:1 and about 1:8, about 1:1 and about 1:7, 1:1 and about 1:6, about 1:1 and about 1:5, about 1:1 and about 1:4, about 1:1 and about 1:3, about 1:1 and about 1:2, about 1:2 and about 1:8, about 1:2 and about 1:7, about 1:2 and about 1:6, about 1:2 and about 1:5, about 1:2 and about 1:4, about 1:2 and about 1:3, about 1:3 and about 1:8, about 1:3 and about 1:7, about 1:3 and about 1:6, about 1:3 and about 1:5, about 1:3 and about 1:4, about 1:4 and about 1:8, about 1:4 and about 1:7, about 1:4 and about 1:6, about 1:4 and about 1:5, about 1:5 and about 1:8, about 1:5 and about 1:7, about 1:5 and about 1:6, about 1:6 and about 1:8, about 1:6 and about 1:7, or about 1:7 and about 1:8. In some embodiments, the molar ratio of the first ligand to fluoride containing ligand is between about 1:1 and about 1:3.

In some embodiments, the molar ratio of the first ligand to the fluoride anions is between about 1:1 and about 1:8, about 1:1 and about 1:7, 1:1 and about 1:6, about 1:1 and about 1:5, about 1:1 and about 1:4, about 1:1 and about 1:3, about 1:1 and about 1:2, about 1:2 and about 1:8, about 1:2 and about 1:7, about 1:2 and about 1:6, about 1:2 and about 1:5, about 1:2 and about 1:4, about 1:2 and about 1:3, about 1:3 and about 1:8, about 1:3 and about 1:7, about 1:3 and about 1:6, about 1:3 and about 1:5, about 1:3 and about 1:4, about 1:4 and about 1:8, about 1:4 and about 1:7, about 1:4 and about 1:6, about 1:4 and about 1:5, about 1:5 and about 1:8, about 1:5 and about 1:7, about 1:5 and about 1:6, about 1:6 and about 1:8, about 1:6 and about 1:7, or about 1:7 and about 1:8. In some embodiments, the molar ratio of the first ligand to fluoride anions is between about 1:1 and about 1:3.

The percentage of first ligands displaced by the fluoride containing ligand can be measured by $^1$H NMR. In some embodiments, the mole percentage of first ligands displaced by the fluoride containing ligand is between about 20% and about 100%, between about 20% and about 80%, between about 20% and about 60%, between about 20% and about 40%, between about 25% and about 100%, between about 25% and about 80%, between about 25% and about 60%, between about 25% and about 40%, between about 30% and about 100%, between about 30% and about 80%, between about 30% and about 60%, between about 30% and about 40%, between about 40% and about 100%, between about 40% and about 80%, between about 40% and about 60%, between about 60% and about 100%, between about 60% and about 80%, between or about 80% and about 100%. In some embodiments, the mole percentage of first ligands displaced by the fluoride containing ligand is about 90%. In some embodiments, the mole percentage of first ligands displaced by the fluoride containing ligand is about 100%.

The percentage of first ligands displaced by the fluoride anions can be measured by $^1$H NMR. In some embodiments, the mole percentage of first ligands displaced by the fluoride anions is between about 20% and about 100%, between about 20% and about 80%, between about 20% and about 60%, between about 20% and about 40%, between about 25% and about 100%, between about 25% and about 80%, between about 25% and about 60%, between about 25% and about 40%, between about 30% and about 100%, between about 30% and about 80%, between about 30% and about 60%, between about 30% and about 40%, between about 40% and about 100%, between about 40% and about 80%, between about 40% and about 60%, between about 60% and about 100%, between about 60% and about 80%, between or about 80% and about 100%. In some embodiments, the mole percentage of first ligands displaced by the fluoride anions is about 90%. In some embodiments, the mole percentage of first ligands displaced by the fluoride anions is about 100%.

The percentage of fluoride containing ligands that are bound to a nanostructure in a population of nanostructures can be measured by $^{19}$F NMR, wherein the bound ligands are calculated using: (bound fluoride containing ligands)/(bound+ free fluoride containing ligands).

In some embodiments, the mole percentage of fluoride containing ligands bound to a nanostructure is between about 20% and about 100% is between about 20% and about 100%, about 20% and about 80%, about 20% and about 60%, about 20% and about 40%, about 25% and about 100%, about 25% and about 80%, about 25% and about 60%, about 25% and about 40%, about 30% and about 100%, about 30% and about 80%, about 30% and about 60%, about 30% and about 40%, about 40% and about 100%, about 40% and about 80%, about 40% and about 60%, about 60% and about 100%, about 60% and about 80%, or about 80% and about 100%.

In some embodiments, the mole percentage of fluoride anions bound to a nanostructure is between about 20% and about 100% is between about 20% and about 100%, about 20% and about 80%, about 20% and about 60%, about 20% and about 40%, about 25% and about 100%, about 25% and about 80%, about 25% and about 60%, about 25% and about 40%, about 30% and about 100%, about 30% and about 80%, about 30% and about 60%, about 30% and about 40%, about 40% and about 100%, about 40% and about 80%, about 40% and about 60%, about 60% and about 100%, about 60% and about 80%, or about 80% and about 100%.

In some embodiments, the present disclosure is directed to a method of preparing a nanostructure composition, the method comprising: (a) providing at least one population of nanostructures; and (b) admixing at least one fluoride containing ligand with the nanostructures of (a); or (b') admixing tetraalkylammonium fluoride with the nanostructures of (a), to produce a nanostructure composition. In some embodiments, the fluoride containing ligand in (b) comprises an anion comprising a fluorozincate and an inorganic cation. In some embodiments, the inorganic cation comprises a metal ion. In some embodiments, the cation comprises a potassium ion. In some embodiments, the fluoride containing ligand in (b) is selected from the group consisting of a fluorozincate, tetrafluoroborate, and hexafluorophosphate.

In some embodiments, the admixing in (b') is with a tetraalkylammonium fluoride wherein the tetralkylammonium is selected from the group consisting of dioctadecyldimethylammonium, dihexadecyldimethylammonium, ditetradecyldimethylammonium, didodecyldimethylammonium, didecyldimethylammonium, dioctyldimethylammonium, bis(ethylhexyl)dimethylammonium, octadecyltrimethylammonium, oleyltrimethylammonium, hexadecyltrimethylammonium, tetradecyltrimethylammonium, dodecyltrimethylammonium, decyltrimethylammonium, octyltrimethylammonium, phenylethyltrimethylammonium, benzyltrimethylammonium, phenyltrimethylammonium, benzylhexadecyldimethylammonium, benzyltetradecyldimethylammonium, benzyldodecyldimethylammonium, benzyldecyldimethylammonium, benzyloctyldimethylammonium, benzyltributylammonium, benzyltriethylammonium, tetrabutylammonium, tetrapropylammonium, diisopropyldimethylammonium, tetraethylammonium, and tetramethylammonium.

In some embodiments, the tetraalkylammonium fluoride is a $C_{1-6}$ tetraalkylammonium fluoride. In some embodiments, the tetraalkylammonium fluoride is tetrabutylammonium fluoride. In some embodiments, the admixing in (b) or (b') is at a temperature between about 10° C. and about 100° C., between about 10° C. and about 80° C., between about 10° C. and about 60° C., between about 10° C. and about 40° C., between about 10° C. and about 20° C., between about 20° C. and about 100° C., between about 20° C. and about 80° C., between about 20° C. and about 60° C., between about 20° C. and about 40° C., between about 40° C. and about 100° C., between about 40° C. and about 80° C., between about 40° C. and about 60° C., between about 60° C. and about 100° C., between about 60° C. and about 80° C., or between about 80° C. and about 100° C.

In some embodiments, the method further comprises (c) admixing at least one organic cation with the nanostructures of (b) or (b') to produce a nanostructure composition. In some embodiments, the organic cation is selected from the group consisting of a tetraalkylammonium, an alkylphosphonium, formamidinium, guanidinium, imidazolium, and pyridinium. In some embodiments, the organic cation is tetraalkylammonium and is selected from the group consisting of dioctadecyldimethylammonium, dihexadecyldimethylammonium, ditetradecyldimethylammonium, didodecyldimethylammonium, didecyldimethylammonium, dioctyldimethylammonium, bis(ethylhexyl)dimethylammonium, octadecyltrimethylammonium, oleyltrimethylammonium, hexadecyltrimethylammonium, tetradecyltrimethylammonium, dodecyltrimethylammonium, decyltrimethylammonium, octyltrimethylammonium, phenylethyltrimethylammonium, benzyltrimethylammonium, phenyltrimethylammonium, benzylhexadecyldimethylammonium, benzyltetradecyldimethylammonium, benzyldodecyldimethylammonium, benzyldecyldimethylammonium, benzyloctyldimethylammonium, benzyltributylammonium, benzyltriethylammonium, tetrabutylammonium, tetrapropylammonium, diisopropyldimethylammonium, tetraethylammonium, and tetramethylammonium. In some embodiments, the organic cation is alkylphosphonium and is selected from the group consisting of tetraphenylphosphonium, dimethyldiphenylphosphonium, methyltriphenoxyphosphonium, hexadecyltributylphosphonium, octyltributylphosphonium, tetradecyltrihexylphosphonium, tetrakis(hydroxymethyl)phosphonium, tetraoctylphosphonium, tetrabutylphosphonium, and tetramethylphosphonium.

In some embodiments, the admixing in (c) is at a temperature between about 10° C. and about 100° C., between about 10° C. and about 80° C., between about 10° C. and about 60° C., between about 10° C. and about 40° C., between about 10° C. and about 20° C., between about 20° C. and about 100° C., between about 20° C. and about 80° C., between about 20° C. and about 60° C., between about 20° C. and about 40° C., between about 40° C. and about 100° C., between about 40° C. and about 80° C., between about 40° C. and about 60° C., between about 60° C. and about 100° C., between about 60° C. and about 80° C., or between about 80° C. and about 100° C.

In some embodiments, the method further comprises (d) dispersing the nanostructures of (c) in a non-polar solvent. In some embodiments, the non-polar solvent is selected from the group consisting of hexane, heptane, octane, toluene, and chloroform.

Optical Properties of Nanostructures Functionalized with a Fluoride Containing Ligand or a Fluoride Anion In some embodiments, the core/shell(s) nanostructures functionalized with a fluoride containing ligand or fluoride anions can display a high photoluminescence quantum yield. In some embodiments, the core/shell(s) nanostructures functionalized with a fluoride containing ligand or fluoride anion can display a photoluminescence quantum yield of between about 60% and about 99%, between about 60% and about 95%, between about 60% and about 90%, between about 60% and about 85%, between about 60% and about 80%, between about 60% and about 70%, between about 70% and about 99%, between about 70% and about 95%, between about 70% and about 90%, between about 70% and about 85%, between about 70% and about 80%, between about 80% and about 99%, between about 80% and about 95%, between about 80% to about 90%, between about 80% and about 85%, between about 85% and about 99%, between about 85% and about 95%, between about 80% and about 85%, between about 85% and about 99%, between about 85% and about 90%, between about 90% and about 99%, between about 90% and about 95%, or between about 95% and about 99%. In some embodiments, the core/shell(s) nanostructures functionalized with a fluoride containing ligand or a fluoride anion can display a photoluminescence quantum yield of between about 60% and about 99%. In some embodiments, the core/shell(s) nanostructures functionalized with a fluoride containing ligand or a fluoride anion can display a photoluminescence quantum yield of between about 70% and about 90%.

The photoluminescence spectrum of the core/shell(s) nanostructures functionalized with a fluoride containing ligand or a fluoride anion can cover essentially any desired portion of the spectrum. In some embodiments, the photoluminescence spectrum for the core/shell(s) nanostructures can have a emission maximum between about 300 nm and about 750 nm, between about 300 nm and about 650 nm, between about 300 nm and about 550 nm, between about 300 nm and about 450 nm, between about 450 nm and about 750 nm, between about 450 nm and about 650 nm, between about 450 nm and about 550 nm, between about 450 nm and about 750 nm, between about 450 nm and about 650 nm, between about 450 nm and about 550 nm, between about 550 nm and about 750 nm, between about 550 nm and about 650 nm, or between about 650 nm and about 750 nm.

In some embodiments, the core/shell(s) nanostructure emit in the red range. In some embodiments, the nanostructure composition exhibits a photoluminescence peak wavelength of between about 600 nm and about 650 nm, between about 600 nm and about 640 nm, between about 600 nm and about 630 nm, between about 600 nm and about 620 nm, between about 600 nm and about 610 nm, between about 610 nm and about 650 nm, between about 610 nm and about 640 nm, between about 610 nm and about 630 nm, between about 610 nm and about 620 nm, between about 620 nm and about 650 nm, between about 620 nm and about 640 nm, between about 620 nm and about 630 nm, between about 630 nm and about 650 nm, between about 630 nm and about 640 nm, or between about 640 nm and about 650 nm. In some embodiments, the core/shell(s) nanostructure comprises a core comprising indium.

In some embodiments, the core/shell(s) nanostructure emit in the green range. In some embodiments, the nanostructure composition exhibits a photoluminescence peak wavelength of between about 510 nm and about 560 nm, between about 510 nm and about 550 nm, between about 510 nm and about 540 nm, between about 510 nm and about 530 nm, between about 510 nm and about 520 nm, between about 520 nm and about 560 nm, between about 520 nm and about 550 nm, between about 520 nm and about 540 nm, between about 520 nm and about 530 nm, between about 530 nm and about 560 nm, between about 530 nm and about 550 nm, between about 530 nm and about 540 nm, between about 540 nm and about 560 nm, between about 540 nm and about 550 nm, or between about 550 nm and about 560 nm. In some embodiments, the core/shell(s) nanostructure emit in the red range. In some embodiments, the nanostructure composition exhibits a photoluminescence peak wavelength of between about 525 nm and about 535 nm. In some embodiments, the core/shell(s) nanostructure comprises a core comprising zinc.

In some embodiments, the core/shell(s) nanostructure emit in the blue, indigo, violet, and/or ultraviolet range. In some embodiments, the nanostructure composition exhibits a photoluminescence peak wavelength of between about 420 nm and about 470 nm, between about 420 nm and about 460 nm, between about 420 nm and about 450 nm, between about 420 nm and about 440 nm, between about 420 nm and about 430 nm, between about 430 nm and about 470 nm, between about 430 nm and about 460 nm, between about 430 nm and about 450 nm, between about 430 nm and about 440 nm, between about 440 nm and about 470 nm, between about 440 nm and about 460 nm, between about 440 nm and about 450 nm, between about 450 nm and about 470 nm, between about 450 nm and about 460 nm, or between about 460 nm and about 470 nm. In some embodiments, the nanostructure composition exhibits a photoluminescence peak wavelength of between about 450 nm and about 460 nm. In some embodiments, the core/shell(s) nanostructure comprises a core comprising zinc.

The size distribution of the core/shell(s) nanostructures functionalized with a fluoride containing ligand or a fluoride anion can be relatively narrow. In some embodiments, the photoluminescence spectrum of the population or core/shell(s) nanostructures functionalized with a fluoride containing ligand or a fluoride anion can have a full width at half maximum of between about 10 nm and about 60 nm, between about 10 nm and about 40 nm, between about 10 nm and about 30 nm, between about 10 nm and about 20 nm, between about 20 nm and about 60 nm, between about 20 nm and about 40 nm, between about 20 nm and about 30 nm, between about 30 nm and about 60 nm, between about 30 nm and about 40 nm, or between about 40 nm and about 60 nm. In some embodiments, the photoluminescence spectrum of the population or core/shell(s) nanostructures functionalized with a fluoride containing ligand or a fluoride anion can have a full width at half maximum of between about 35 nm and about 45 nm.

Increased Colloidal Stability of Nanostructures Functionalized with a Fluoride Containing Ligand or a Fluoride Anion In some embodiments, the nanostructures are stored as a colloidal suspension in a solvent. A colloid is a mixture in which one substance of microscopically dispersed insoluble particles is suspended throughout another substance. Colloidal stability can be determined by measuring the number of insoluble particles remaining suspended at equilibrium. Colloidal stability can be hindered by aggregation or sedimentation of the insoluble particles.

Passivating the nanostructures with a fluoride containing ligand or a fluoride anion provides increased colloidal stability and allows for storage of the nanoparticles for extended periods of time. In some embodiments, the nanostructures functionalized with a fluoride containing ligand or a fluoride anion can be stored at a temperature between about 10° C. and about 90° C. for between about 1 minute and about 3 years, about 1 minute and about 12 months, about 1 minute and about 6 months, about 1 minute and about 3 months, about 1 minute and about 1 month, about 1 minute and about 15 days, about 1 minute and about 1 day, about 1 day and about 3 years, about 1 day and about 12 months, about 1 day and about 6 months, about 1 day and about 3 months, about 1 day and about 1 month, about 1 day and about 7 days, about 1 day and about 15 days, about 1 day and about 7 days, about 1 day and about 2 days, about 2 days and about 3 years, about 2 days and about 12 months, about 2 days and about 6 months, about 2 days and about 3 months, about 2 days and about 1 month, about 2 days and about 15 days, about 2 days and about 7 days, about 7 days and about 3 years, about 7 days and about 12 months, about 7 day and about 6 months, about 7 days and about 3 months, about 7 days and about 1 month, about 7 days and about 15 days, about 15 days and about 3 years, about 15 days and about 12 months, about 15 days and about 6 months, about 15 days and about 3 months, about 15 days and about 1 month, about 1 month and about 3 years, about 1 month and about 12 months, about 1 month and about 6 months, about 1 month and about 3 months, about 3 months and about 3 years, about 3 months and about 12 months, about 3 months and about 6 months, about 6 months and about 3 years, about 6 months and about 12 months, or about 12 months and about 3 years.

In some embodiments, nanostructures functionalized with a fluoride containing ligand or a fluoride anion can be stored at a temperature between about 30° C. and about 90° C. for between about 1 minute and about 3 years, about 1 minute and about 12 months, about 1 minute and about 6 months, about 1 minute and about 3 months, about 1 minute and about 1 month, about 1 minute and about 15 days, about 1 minute and about 1 day, about 1 day and about 3 years, about 1 day and about 12 months, about 1 day and about 6 months, about 1 day and about 3 months, about 1 day and about 1 month, about 1 day and about 7 days, about 1 day and about 15 days, about 1 day and about 7 days, about 1 day and about 2 days, about 2 days and about 3 years, about 2 days and about 12 months, about 2 days and about 6 months, about 2 days and about 3 months, about 2 days and about 1 month, about 2 days and about 15 days, about 2 days and about 7 days, about 7 days and about 3 years, about 7 days and about 12 months, about 7 day and about 6 months, about 7 days and about 3 months, about 7 days and about 1 month, about 7 days and about 15 days, about 15 days and about 3 years, about 15 days and about 12 months, about 15 days and about 6 months, about 15 days and about 3 months, about 15 days and about 1 month, about 1 month and about 3 years, about 1 month and about 12 months, about 1 month and about 6 months, about 1 month and about 3 months, about 3 months and about 3 years, about 3 months and about 12 months, about 3 months and about 6 months, about 6 months and about 3 years, about 6 months and about 12 months, or about 12 months and about 3 years.

Nanostructure Film

In some embodiments, the core/shell(s) nanostructures functionalized with a fluoride containing ligand or a fluoride anion are incorporated into a nanostructure film. In some embodiments, the nanostructure film comprises at least one population of nanostructures, wherein the nanostructures comprise: (a) at least one population of nanostructures, the nanostructures comprising a core and at least one shell; and (b) at least one fluoride containing ligand bound to the surface of the nanostructure; or (b') fluoride anions bound to the surface of the nanostructure; wherein the fluoride containing ligand is selected from the group consisting of a fluorozincate, tetrafluoroborate, and hexafluorophosphate. In some embodiments, the nanostructure film comprises between one and five populations of nanostructures. In some embodiments, the nanostructure film comprises one population of nanostructures.

In some embodiments, the nanostructure film further comprises at least one organic resin. In some embodiments, the nanostructure film further comprises one organic resin. In some embodiments, the nanostructure film further comprises between one and five organic resin. In some embodiments, the core/shell(s) nanostructures functionalized with a fluoride containing ligand or fluoride anion are embedded in a matrix comprising at least one organic resin. In some embodiments, the at least one organic resin is a thermosetting resin or a UV curable resin. In some embodiments, the at least one organic resin is a UV curable resin. As used herein, the term "embedded" is used to indicate that the nanostructures are enclosed or encased within a matrix material that makes up the majority component of the matrix. In some embodiments, the nanostructures are uniformly distributed throughout the matrix material. In some embodiments, the nanostructures are distributed according to an application-specific uniformity distribution function.

In some embodiments, the nanostructures can include a homogenous population having sizes that emit in the blue visible wavelength spectrum, in the green visible wavelength spectrum, or in the red visible wavelength spectrum. In some embodiments, the nanostructures can include a first population of nanostructures having sizes that emit in the blue visible wavelength spectrum, a second population of nanostructures having sizes that emit in the green visible wavelength spectrum, and a third population of nanostructures having sizes that emit in the red visible wavelength spectrum.

The matrix material can be any suitable host matrix material capable of housing nanostructures. Suitable matrix materials can be chemically and optically compatible with nanostructures and any surrounding packaging materials or layers used in applying a nanostructure film to devices. Suitable matrix materials can include non-yellowing optical materials that are transparent to both the primary and secondary light, thereby allowing for both primary and secondary light to transmit through the matrix material. Matrix materials can include polymers and organic and inorganic oxides. Suitable polymers for use in the matrix material can be any polymer known to the ordinarily skilled artisan that can be used for such a purpose. The polymer can be substantially translucent or substantially transparent. Matrix materials can include, but not limited to, epoxies, acrylates, norbornene, polyethylene, poly(vinyl butyral): poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are cross-linked with bifunctional monomers, such as divinylbenzene; cross-linkers suitable for cross-linking ligand materials, epoxides that combine with ligand amines (e.g., APS or polyethylene imine ligand amines) to form epoxy, and the like.

In some embodiments, the matrix material includes scattering microbeads such as $TiO_2$ microbeads, ZnS microbeads, or glass microbeads that can improve photo conversion efficiency of the nanostructure film. In some embodiments, the matrix material can include light blocking elements.

In some embodiments, the matrix material can have low oxygen and moisture permeability, exhibit high photo- and chemical-stability, exhibit favorable refractive indices, and adhere to outer surfaces of the nanostructures, thus providing an air-tight seal to protect the nanostructures. In another embodiment, the matrix material can be curable with UV or thermal curing methods to facilitate roll-to-roll processing.

In some embodiments, a nanostructure film can be formed by mixing nanostructures in a polymer (e.g., photoresist) and casting the nanostructure-polymer mixture on a substrate, mixing the nanostructures with monomers and polymerizing them together, mixing nanostructures in a sol-gel to form an oxide, or any other method known to those skilled in the art.

In some embodiments, the formation of a nanostructure film can include a film extrusion process. The film extrusion process can include forming a homogenous mixture of matrix material and barrier layer coated core-shell nanostructures such as nanostructures functionalized with a fluoride containing ligand or fluoride anions, introducing the homogenous mixture into a top mounted hopper that feeds into an extruder. In some embodiments, the homogenous mixture can be in the form of pellets. The film extrusion process can further include extruding a nanostructure film from a slot die and passing an extruded nanostructure film through chill rolls. In some embodiments, the extruded nanostructure film can have a thickness less than about 75 µm, for example, in a range from about 70 µm to about 40 µm, about 65 µm to about 40 µm, about 60 µm to about 40 µm, or about 50 µm to about 40 µm. In some embodiments, the nanostructure film has a thickness less than about 10 µm. In some embodiments, the formation of the nanostructure film can optionally include a secondary process followed by the film extrusion process. The secondary process can include a process such as co-extrusion, thermoforming, vacuum forming, plasma treatment, molding, and/or embossing to provide a texture to a top surface of the nanostructure film layer. The textured top surface nanostructure film can help to improve, for example defined optical diffusion property and/or defined angular optical emission property of the nanostructure film.

Molded Article

In some embodiments, the present disclosure provides a molded article comprising any nanostructures disclosed herein. In some embodiments, the present disclosure provides a molded article comprising any nanostructure film disclosed herein. In some embodiments, the present disclosure provides a molded article comprising a nanostructure, the nanostructure comprising: (a) at least one population of nanostructures, the nanostructures comprising a core and at least one shell; and (b) at least one fluoride containing ligand bound to the surface of the nanostructure; or (b') fluoride anions bound to the surface of the nanostructure; wherein the fluoride containing ligand is selected from the group consisting of a fluorozincate, tetrafluoroborate, and hexafluorophosphate. In some embodiments, the nanostructure is a quantum dot.

In some embodiments, the molded article is a film, a substrate for a display device, or a light emitting diode. In some embodiments, the molded article is an electroluminescent device.

In some embodiments, the molded article comprises a quantum dot layer. In some embodiments, the quantum dot layer comprises a patterned quantum dot layer.

In some embodiments, the quantum dot layer has a thickness between about 1 µm and about 25 µm. In some embodiments, the quantum dot layer has a thickness between about 5 µm and about 25 µm. In some embodiments, the quantum dot layer has a thickness between about 10 µm and about 12 µm.

Making a Nanostructure Layer

In some embodiments, the nanostructure layer can be embedded in a polymeric matrix. As used herein, the term "embedded" is used to indicate that the nanostructure population is enclosed or encased with the polymer that makes up the majority of the components of the matrix. In some embodiments, at least one nanostructure population is suitably uniformly distributed throughout the matrix. In some embodiments, the at least one nanostructure population is distributed according to an application-specific distribution. In some embodiments, the nanostructures are mixed in a polymer and applied to the surface of a substrate.

In some embodiments, a nanostructure composition is deposited to form a nanostructure layer. In some embodiments, a nanostructure composition can be deposited by any suitable method known in the art, including but not limited to painting, spray coating, solvent spraying, wet coating, adhesive coating, spin coating, tape-coating, roll coating, flow coating, inkjet vapor jetting, drop casting, blade coating, mist deposition, or a combination thereof. The nanostructure composition can be coated directly onto the desired layer of a substrate. Alternatively, the nanostructure composition can be formed into a solid layer as an independent element and subsequently applied to the substrate. In some embodiments, the nanostructure composition can be deposited on one or more barrier layers.

In some embodiments, the nanostructure layer is cured after deposition. Suitable curing methods include photo-curing, such as UV curing, and thermal curing. Traditional laminate film processing methods, tape-coating methods, and/or roll-to-roll fabrication methods can be employed in forming a nanostructure layer.

Spin Coating

In some embodiments, the nanostructure composition is deposited onto a substrate using spin coating. In spin coating a small amount of material is typically deposited onto the center of a substrate loaded onto a machine called the spinner which is secured by a vacuum. A high speed of rotation is applied on the substrate through the spinner which causes centripetal force to spread the material from the center to the edge of the substrate. While most of the material is spun off, a certain amount remains of the substrate, forming a thin film of material on the surface as the rotation continues. The final thickness of the film is determined by the nature of the deposited material and the substrate in addition to the parameters chosen for the spin process such as spin speed, acceleration, and spin time. The spin coating condition required to achieve a controlled thickness is highly dependent upon the viscosity of the deposited material and the temperature. In some embodiments, a spin speed of about 1500 rpm to about 6000 rpm is used with a spin time of about 10-60 seconds.

Mist Deposition

In some embodiments, the nanostructure composition is deposited onto a substrate using mist deposition. Mist deposition takes place at room temperature and atmospheric pressure and allows precise control over film thickness by changing the process conditions. During mist deposition, a liquid source material is turned into a very fine mist and carried to the deposition chamber by nitrogen gas. The mist is then drawn to a wafer surface by a high voltage potential between the field screen and the wafer holder. Once the droplets coalesce on the wafer surface, the wafer is removed from the chamber and thermally cured to allow the solvent to evaporate. The liquid precursor is a mixture of solvent and material to be deposited. It is carried to the atomizer by pressurized nitrogen gas. Price, S. C., et al., "Formation of Ultra-Thin Quantum Dot Films by Mist Deposition," *ESC Transactions* 11:89-94 (2007).

Spray Coating

In some embodiments, the nanostructure composition is deposited onto a substrate using spray coating. The typical equipment for spray coating comprises a spray nozzle, an atomizer, a precursor solution, and a carrier gas. In the spray deposition process, a precursor solution is pulverized into micro sized drops by means of a carrier gas or by atomization (e.g., ultrasonic, air blast, or electrostatic). The droplets that come out of the atomizer are accelerated by the substrate surface through the nozzle by help of the carrier gas which is controlled and regulated as desired. Relative motion between the spray nozzle and the substrate is defined by design for the purpose of full coverage on the substrate.

In some embodiments, application of the nanostructure composition further comprises a solvent. In some embodiments, the solvent for application of the nanostructure composition is water, organic solvents, inorganic solvents, halogenated organic solvents, or mixtures thereof. Illustrative solvents include, but are not limited to, water, $D_2O$, acetone, ethanol, dioxane, ethyl acetate, methyl ethyl ketone, isopropanol, anisole, γ-butyrolactone, dimethylformamide, N-methylpyrrolidinone, dimethylacetamide, hexamethylphosphoramide, toluene, dimethylsulfoxide, cyclopentanone, tetramethylene sulfoxide, xylene, ε-caprolactone, tetrahydrofuran, tetrachloroethylene, chloroform, chlorobenzene, dichloromethane, 1,2-dichloroethane, 1,1,2,2-tetrachloroethane, or mixtures thereof.

In some embodiments, the nanostructure compositions are thermally cured to form the nanostructure layer. In some embodiments, the compositions are cured using UV light. In some embodiments, the nanostructure composition is coated directly onto a barrier layer of a nanostructure film, and an additional barrier layer is subsequently deposited upon the nanostructure layer to create the nanostructure film. A support substrate can be employed beneath the barrier film for added strength, stability, and coating uniformity, and to prevent material inconsistency, air bubble formation, and wrinkling or folding of the barrier layer material or other materials. Additionally, one or more barrier layers are preferably deposited over a nanostructure layer to seal the material between the top and bottom barrier layers. Suitably, the barrier layers can be deposited as a laminate film and optionally sealed or further processed, followed by incorporation of the nanostructure film into the particular lighting device. The nanostructure composition deposition process can include additional or varied components, as will be understood by persons of ordinary skill in the art. Such embodiments will allow for in-line process adjustments of the nanostructure emission characteristics, such as brightness and color (e.g., to adjust the quantum dot film white point), as well as the nanostructure film thickness and other characteristics. Additionally, these embodiments will allow for periodic testing of the nanostructure film characteristics during production, as well as any necessary toggling to achieve precise nanostructure film characteristics. Such testing and adjustments can also be accomplished without changing the mechanical configuration of the processing line, as a computer program can be employed to electronically change the respective amounts of mixtures to be used in forming a nanostructure film.

Barrier Layers

In some embodiments, the molded article comprises one or more barrier layers disposed on either one or both sides of the nanostructure layer. Suitable barrier layers protect the nanostructure layer and the molded article from environmental conditions such as high temperatures, oxygen, and moisture. Suitable barrier materials include non-yellowing, transparent optical materials which are hydrophobic, chemically and mechanically compatible with the molded article, exhibit photo- and chemical-stability, and can withstand high temperatures. In some embodiments, the one or more barrier layers are index-matched to the molded article. In some embodiments, the matrix material of the molded article and the one or more adjacent barrier layers are index-matched to have similar refractive indices, such that most of the light transmitting through the barrier layer toward the molded article is transmitted from the barrier layer into the nanostructure layer. This index-matching reduces optical losses at the interface between the barrier and matrix materials.

The barrier layers are suitably solid materials, and can be a cured liquid, gel, or polymer. The barrier layers can comprise flexible or non-flexible materials, depending on the particular application. Barrier layers are preferably planar layers, and can include any suitable shape and surface area configuration, depending on the particular lighting application. In some embodiments, the one or more barrier layers will be compatible with laminate film processing techniques, whereby the nanostructure layer is disposed on at least a first barrier layer, and at least a second barrier layer is disposed on the nanostructure layer on a side opposite the nanostructure layer to form the molded article according to one embodiment. Suitable barrier materials include any suitable barrier materials known in the art. In some embodiments, suitable barrier materials include glasses, polymers, and oxides. Suitable barrier layer materials include, but are not limited to, polymers such as polyethylene terephthalate (PET); oxides such as silicon oxide, titanium oxide, or aluminum oxide (e.g., $SiO_2$, $Si_2O_3$, $TiO_2$, or $Al_2O_3$); and suitable combinations thereof. Preferably, each barrier layer of the molded article comprises at least 2 layers comprising different materials or compositions, such that the multi-layered barrier eliminates or reduces pinhole defect alignment in the barrier layer, providing an effective barrier to oxygen and moisture penetration into the nanostructure layer. The nanostructure layer can include any suitable material or combination of materials and any suitable number of barrier layers on either or both sides of the nanostructure layer. The materials, thickness, and number of barrier layers will depend on the particular application, and will suitably be chosen to maximize barrier protection and brightness of the nanostructure layer while minimizing thickness of the molded article. In preferred embodiments, each barrier layer comprises a laminate film, preferably a dual laminate film, wherein the thickness of each barrier layer is sufficiently thick to eliminate wrinkling in roll-to-roll or laminate manufacturing processes. The number or thickness of the barriers may further depend on legal toxicity guidelines in embodiments where the nanostructures comprise heavy metals or other toxic materials, which guidelines may require more or thicker barrier layers. Additional considerations for the barriers include cost, availability, and mechanical strength.

In some embodiments, the nanostructure film comprises two or more barrier layers adjacent each side of the nanostructure layer, for example, two or three layers on each side or two barrier layers on each side of the nanostructure layer. In some embodiments, each barrier layer comprises a thin glass sheet, e.g., glass sheets having a thickness of about 100 µm, 100 µm or less, or 50 µm or less.

Each barrier layer of the molded article can have any suitable thickness, which will depend on the particular requirements and characteristics of the lighting device and application, as well as the individual film components such as the barrier layers and the nanostructure layer, as will be understood by persons of ordinary skill in the art. In some embodiments, each barrier layer can have a thickness of 50 µm or less, 40 µm or less, 30 µm or less, 25 µm or less, 20 µm or less, or 15 µm or less. In certain embodiments, the barrier layer comprises an oxide coating, which can comprise materials such as silicon oxide, titanium oxide, and aluminum oxide (e.g., $SiO_2$, $Si_2O_3$, $TiO_2$, or $Al_2O_3$). The oxide coating can have a thickness of about 10 µm or less, 5 µm or less, 1 µm or less, or 100 nm or less. In certain embodiments, the barrier comprises a thin oxide coating with a thickness of about 100 nm or less, 10 nm or less, 5 nm or less, or 3 nm or less. The top and/or bottom barrier can consist of the thin oxide coating, or may comprise the thin oxide coating and one or more additional material layers.

Nanostructure Layer Features and Embodiments

In some embodiments, the nanostructure layers are used to form display devices. As used herein, a display device refers to any system with a lighting display. Such devices include, but are not limited to, devices encompassing a liquid crystal display, an emissive display such as an organic light emitting diode (OLED) or microLED, televisions, computers, mobile phones, smart phones, personal digital assistants (PDAs), gaming devices, electronic reading devices, digital cameras, and the like.

In some embodiments, the nanostructures are incorporated into display devices by "on-chip" placements. As used herein, "on-chip" refers to placing nanostructures into a light emitting diode cup. In some embodiments, the nanostructures are dissolved in a resin or a fluid to fill the light emitting diode cup. In some embodiments, the nanostructures are incorporated into display devices by "near-chip" placements. As used herein, "near-chip" refers to coating the top surface of the light emitting diode assembly with nanostructures such that the outgoing light passes through the nanostructure film.

Electroluminescent Device

In some embodiments, the molded article is an electroluminescent device. In some embodiments, the nanostructure molded article is a liquid crystal display or a light emitting diode.

In some embodiments, the nanostructure composition is used to form the emitting layer of an illumination device. The illumination device can be used in a wide variety of applications, such as flexible electronics, touchscreens, monitors, televisions, cellphones, and any other high definition displays. In some embodiments, the illumination device is a light emitting diode or a liquid crystal display. In some embodiments, the illumination device is a quantum dot light emitting diode (QLED). An example of a QLED is disclosed in U.S. patent application Ser. No. 15/824,701, which is incorporated herein by reference in its entirety.

In some embodiments, the present disclosure provides a light emitting diode comprising:
 (a) a first conductive layer;
 (b) a second conductive layer; and
 (c) an emitting layer between the first conductive layer and the second conductive layer, wherein the emitting layer comprises at least one population of nanostructures, the nanostructures comprising (a) at least one population of nanostructures; and (b) at least one fluoride containing ligand bound to the surface of the nanostructure; wherein the fluoride containing ligand is selected from the group consisting of a fluorozincate, tetrafluoroborate, and hexafluorophosphate.

In some embodiments, the present disclosure provides a light emitting diode comprising:
 (a) a first conductive layer;
 (b) a second conductive layer; and
 (c) an emitting layer between the first conductive layer and the second conductive layer, wherein the emitting layer comprises at least one population of nanostructures, the nanostructures comprising (a) at least one population of nanostructures; and (b) fluoride anions bound to the surface of the nanostructure.

In some embodiments, the emitting layer is a nanostructure film.

In some embodiments, the light emitting diode comprises a first conductive layer, a second conductive layer, and an emitting layer, wherein the emitting layer is arranged between the first conductive layer and the second conductive layer. In some embodiments, the emitting layer is a thin film.

In some embodiments, the light emitting diode comprises additional layers between the first conductive layer and the second conductive layer such as a hole injection layer, a hole transport layer, and an electron transport layer. In some embodiments, the hole injection layer, the hole transport layer, and the electron transport layer are thin films. In some embodiments, the layers are stacked on a substrate.

When voltage is applied to the first conductive layer and the second conductive layer, holes injected at the first conductive layer move to the emitting layer via the hole injection layer and/or the hole transport layer, and electrons injected from the second conductive layer move to the emitting layer via the electron transport layer. The holes and electrons recombine in the emitting layer to generate excitons.

Substrate

The substrate can be any substrate that is commonly used in the manufacture of light emitting diodes. In some embodiments, the substrate is a transparent substrate, such as glass. In some embodiments, the substrate is a flexible material such as polyimide, or a flexible and transparent material such as polyethylene terephthalate. In some embodiments, the substrate has a thickness of about 0.1 mm to 2 mm. In some embodiments, the substrate is a glass substrate, a plastic substrate, a metal substrate, or a silicon substrate.

First Conductive Layer

In some embodiments, a first conductive layer is disposed on the substrate. In some embodiments, the first conductive layer is a stack of conductive layers. In some embodiments, the first conductive layer has a thickness between about 50 nm and about 250 nm. In some embodiments, the first conductive layer is deposited as a thin film using any known deposition technique, such as, for example, sputtering or electron-beam evaporation. In some embodiments, the first conductive layer comprises indium tin oxide (ITO), indium zinc oxide, tin dioxide, zinc oxide, magnesium, aluminum, aluminum-lithium, calcium, magnesium-indium, magnesium-silver, silver, gold, or mixtures thereof. In some embodiments, the first conductive layer is an anode.

Second Conductive Layer

In some embodiments, the total layer structure can be sandwiched between a first conductive layer and a second conductive layer. In some embodiments, the first conductive layer acts as the anode of the device while second conductive layer acts as the cathode of the device. In some embodiments, the second conductive layer is a metal, such as aluminum. In some embodiments, the second conductive layer has a thickness between about 100 nm and about 150 nm. In some embodiments, the second conductive layer represents a stack of conductive layers. For example, a second conductive layer can include a layer of silver sandwiched between two layers of ITO (ITO/Ag/ITO).

In some embodiments, the second conductive layer comprises indium tin oxide, an alloy of indium oxide and zinc, titanium dioxide, tin oxide, zinc sulfide, silver, or mixtures thereof.

Semiconductor Polymer Layer

In some embodiments, the light emitting diode further comprises a semiconductor polymer layer. In some embodiments, the semiconductor polymer layer acts as a hole injection layer. In some embodiments, the semiconductor polymer layer is deposited on the first conductive layer. In some embodiments, the semiconductor polymer layer is deposited by vacuum deposition, spin-coating, printing, casting, slot-die coating, or Langmuir-Blodgett (LB) deposition. In some embodiments, the semiconductor polymer layer has a thickness between about 20 nm and about 60 nm.

In some embodiments, the semiconductor polymer layer comprises copper phthalocyanine, 4,4',4"-tris[(3-methylphenyl)phenylamino] triphenylamine (m-MTDATA), 4,4',4"-tris(diphenylamino)triphenylamine (TDATA), 4,4',4"-tris[2-naphthyl(phenyl)amino]triphenylamine (2T-NATA), polyaniline/dodecylbenzenesulfonic acid, poly(3,4-ethylenedioxythiophene)/polystyrene sulfonate) (PEDOT/PSS), polyaniline/camphor sulfonic acid, or polyaniline/poly(4-styrenesulfonate).

First Transport Layer

In some embodiments, the light emitting diode further comprises transport layers to facilitate the transport of electrons and holes affected by the generated electric field between the first conductive layer and the second conductive layer. In some embodiments, the light emitting diode further comprises a first transport layer associated with the first conductive layer. In some embodiments, the first transport layer acts as a hole transport layer (and an electron and/or exciton blocking layer). In some embodiments, the first transport layer is deposited on the first conductive layer. In some embodiments, the first transport layer is deposited on the semiconductor polymer layer. In some embodiments, the first transport layer has a thickness between about 20 nm and about 50 nm. In some embodiments, the first transport layer is substantially transparent to visible light.

In some embodiments, the first transport layer comprises a material selected from the group consisting of an amine, a triarylamine, a thiophene, a carbazole, a phthalocyanine, a porphyrin, or a mixture thereof. In some embodiments, the first transport layer comprises N,N'-di(naphthalen-1-yl)-N,N'-bis(4-vinylphenyl)-4,4'-diamine, poly[(9,9-dioctylfluorenyl-2,7-diyl)-co-(4,4'-(N-(4-sec-butylphenyl))diphenylamine)], or poly(9-vinylcarbazole).

Second Transport Layer

In some embodiments, the light emitting diode further comprises a second transport layer. In some embodiments, the second transport layer acts as an electron transport layer (and a hole and/or exciton blocking layer). In some embodiments, the second transport layer contacts the emitting layer. In some embodiments, the second transport layer is arranged between the emitting layer and the second conductive layer. In some embodiments, the second transport layer has a thickness between about 20 nm and about 50 nm. In some embodiments, the second transport layer is substantially transparent to visible light.

In some embodiments, the second transport layer comprises a material selected from the group consisting of an imidazole, a pyridine, a pyrimidine, a pyridazine, a pyraxine, an oxadiazole, a chinoline, a chinoxaline, an anthracene, a benzanthracene, a pyrene, a perylene, a benzimidazole, a triazine, a ketone, a phosphinoxide, a phenazine, a phenanthroline, a triarylborane, a metal oxide, and combinations thereof. In some embodiments, the second transport layer comprises 1,3-bis(3,5-dipyrid-3-ylphenyl)benzene (B3PyPB), bathocuproine, bathophenanthroline, 3-(biphenyl-4-yl)-5-(4-tert-butylphenyl)-4-phenyl-4H-1,2,4-triazole, 2-(4-biphenylyl)-5-phenyl-1,3,4-oxadiazole, 3,5-bis(4-tert-butylphenyl)-4-phenyl-4H-1,2,4-triazole, bis(8-hydroxy-2-methylquinoline)-(4-phenylphenoxy)aluminum, 2,5-bis(1-naphthyl)-1,3,4-oxadiazole, 3,5-diphenyl-4-(1-naphthyl)-1H-1,2,4-triazole, 1,3,5-tri(m-pyridin-3-ylphenyl)benzene (TmPyPB), 2,2',2"-(1,3,5-benzinetriyl)-tris(1- phenyl-1-H-benzimidazole) (TPBi), tris-(8-hydroxyquinoline)aluminum, $TiO_2$, ZnO, $SnO_2$, $SiO_2$, $ZrO_2$, or ZnMgO. In some embodiments, the second transport layer comprises ZnMgO.

The roles of the first transport layer and the second transport layer are reversed when the polarity of the first conductive layer and the second conductive layer are reversed.

Quantum Dot on Glass Liquid Crystal Display Device

In some embodiments, the nanostructure film is incorporated into a quantum dot on glass liquid crystal display device. A liquid crystal display device can include a nanostructure film formed directly on a light guide plate (LGP) without necessitating an intermediate substrate or barrier layer. In some embodiments, a nanostructure film can be a thin film. In some embodiments, a nanostructure film can have a thickness of 500 µm or less, 100 µm or less, or 50 µm or less. In some embodiments, a nanostructure film is a thin film having a thickness of about 15 µm or less.

An LGP can include an optical cavity having one or more sides, including at least a top side, comprising glass. Glass provides excellent resistance to impurities including moisture and air. Moreover, glass can be formed as a thin substrate while maintaining structural rigidity. Therefore, an LGP can be formed at least partially of a glass surface to provide a substrate having sufficient barrier and structural properties.

In some embodiments, a nanostructure film can be formed on an LGP. In some embodiments, the nanostructure film comprises a population of nanostructures embedded in a matrix material, such as a resin. A nanostructure film can be formed on an LGP by any method known in the art, such as wet coating, painting, spin coating, or screen printing. After deposition, a resin of a nanostructure film can be cured. In some embodiments a resin of one or more nanostructure films can be partially cured, further processed and then finally cured. The nanostructure films can be deposited as one layer or as separate layers, and the separate layers can comprise varying properties. The width and height of the nanostructure films can be any desired dimensions, depending on the size of the viewing panel of the display device. For example, the nanostructure films can have a relatively small surface area in small display device embodiments such as watches and phones, or the nanostructure films can have a large surface area for large display device embodiments such as TVs and computer monitors.

In some embodiments, an optically transparent substrate is formed on a nanostructure film by any method known in the art, such as vacuum deposition, vapor deposition, or the like. An optically transparent substrate can be configured to provide environmental sealing to the underlying layers and/or structures of the nanostructure film. In some embodiments, light blocking elements can be included in the optically transparent substrate. In some embodiments, light blocking elements can be included in a second polarizing filter, which can be positioned between the substrate and the nanostructure film. In some embodiments, light blocking elements can be dichroic filters that, for example, can reflect the primary light (e.g., blue light, UV light, or combination of UV light and blue light) while transmitting the secondary light. Light blocking elements can include specific UV light filtering components to remove any unconverted UV light from the red and green sub-pixels, and/or the UV light from the blue sub-pixels.

Molded Articles with Improved Properties

In some embodiments, a molded article prepared using the nanostructures shows an EQE of between about 1.5% and about 20%, about 1.5% and about 15%, about 1.5% and about 12%, about 1.5% and about 10%, about 1.5% and about 8%, about 1.5% and about 4%, about 1.5% and about 3%, about 3% and about 20%, about 3% and about 15%, about 3% and about 12%, about 3% and about 10%, about 3% and about 8%, about 8% and about 20%, about 8% and about 15%, about 8% and about 12%, about 8% and about 10%, about 10% and about 20%, about 10% and about 15%, about 10% and about 12%, about 12% and about 20%, about 12% and about 15%, or about 15% and about 20%. In some embodiments, a molded article prepared using the nanostructures shows an EQE of between about 1.5% and about 15%. %. In some embodiments, a molded article prepared using the nanostructures shows an EQE of about 5%. In some embodiments, the nanostructure is a quantum dot. In some embodiments, the molded article is a light emitting diode.

The molded article shows improved stability as measured by the time under operation to reach 80% of initial luminance (500 nits), wherein the molded article is an electroluminescent device. In some embodiments, the electroluminescent device reaches 80% of initial luminance after between about 100 seconds and about 700 seconds, between about 100 seconds and about 600 seconds, between about 100 seconds and about 500 seconds, between about 100 seconds and about 400 seconds, between about 100 seconds and about 300 seconds, between about 100 seconds and about 200 seconds, between about 200 seconds and about 700 seconds, between about 200 seconds and about 600 seconds, between about 200 seconds and about 500 seconds, between about 200 seconds and about 400 seconds, between about 200 seconds and about 300 seconds, between about 300 seconds and about 700 seconds, between about 300 seconds and about 600 seconds, between about 300 seconds and about 500 seconds, between about 300 seconds and about 400 seconds, between about 400 seconds and about 700 seconds, between about 400 seconds and about 600 seconds, between about 400 seconds and about 500 seconds, between about 500 seconds and about 700 seconds, between about 500 seconds and about 600 seconds, or between about 600 seconds and about 700 seconds. In some embodiments, the electroluminescent device reaches 80% of initial luminance after about 600 seconds. In some embodiments, the electroluminescent device reaches 50% of initial luminance after between about 6 hours and about 11 hours, between about 6 hours and about 10 hours, between about 6 hours and about 9 hours, between about 6 hours and about 8 hours, between about 6 hours and about 7 hours, between about 7 hours and about 11 hours, between about 7 hours and about 10 hours, between about 7 hours and about 9 hours, between about 7 hours and about 8 hours, between about 8 hours and about 11 hours, between about 8 hours and about 10 hours, between about 8 hours and about 9 hours, between about 9 hours and about 11 hours, between about 9 hours and about 10 hours, or between about 10 hours and about 11 hours. In some embodiments, the electroluminescent device reaches 50% of initial luminance after about 10 hours.

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

EXAMPLES

Example 1

Ligand Exchange and Property of Nanostructures

Carboxylate ligands were exchanged for halozincate ligands (e.g. tetrachlorozincate, tetrafluorozincate, dichlorodifluorozincate) which were expected to undergo electrochemical oxidation at a higher voltage than the carboxylate ligands. In a subsequent step, potassium counterions of the tetrafluorozincate-capped nanostructures were exchanged for tetraalkylammonium cations, which enabled solubility in non-polar solvents and made the exchanged nanostructures compatible to typical fabrication processes and structures of electroluminescent QD-LEDs. FIG. 1 is a flow chart showing a ligand exchange procedure from carboxylate-capped nanostructures to tetrafluorozincate-capped nanostructures with tetraalkylammonium counterions.

Figure 2:
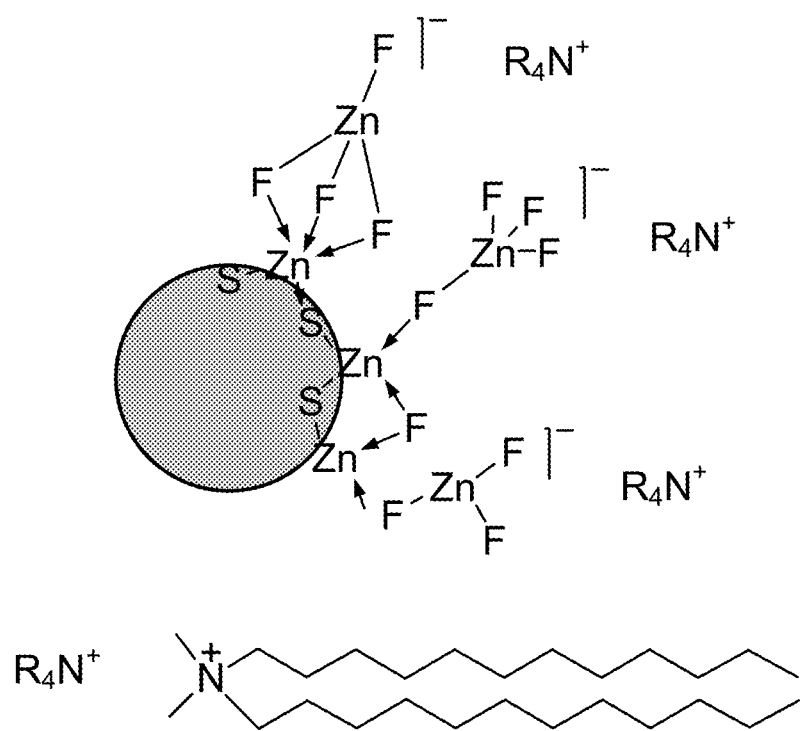
FIG. 2 is a schematic illustration of the coordinative binding of tetrafluorozincate to the nanostructure surface via monodentate and multidentate coordination modes.

FIG. 2 is a schematic illustration of the coordinative binding of tetrafluorozincate to the nanostructure surface via monodentate and multidentate coordination modes and illustrates the interaction between nanostructure, fluorometallate ligand and ammonium cation. The ammonium salt surfactant was not considered a ligand because it did not bind coordinatively to the nanostructure surface. Surface passivation was provided by the inorganic halometallate ligand.

Ammonium cations were associated with the charged nanostructure surface via non-directional electrostatic interaction.

Figure 3:
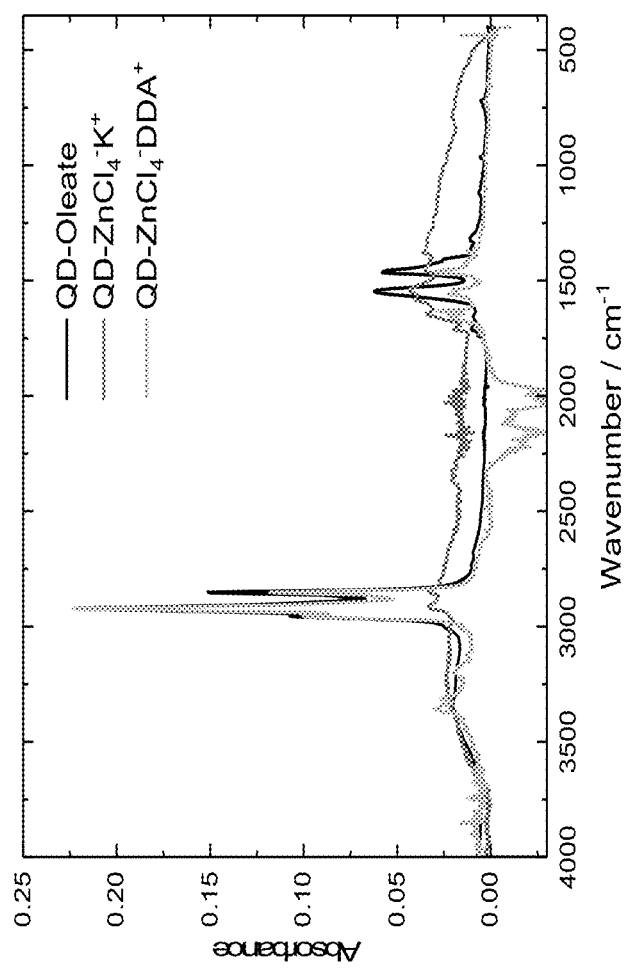
FIG. 3 shows Infrared spectra of nanostructures capped with oleate; nanostructures capped with tetrachlorozincate and potassium counterions; and nanostructures capped with tetrachlorozincate and didodecyldimethylammonium counterions.

The exchange procedure applied to red InP nanostructures was tracked by infrared spectroscopy (FIG. 3). FIG. 3 shows Infrared spectra of nanostructures (Sample 3 in Table 1) capped with oleate; nanostructures capped with tetrachlorozincate and potassium counterions; and nanostructures capped with tetrachlorozincate and didodecyldimethylammonium counterions. The nanostructures capped with tetrachlorozincate and potassium counterions showed hardly any alkyl signals (about 2900 cm$^{-1}$) which proved the almost complete displacement of the original oleate ligands. After cation exchange from potassium to didodecyldimethylammonium, signals corresponding to the ammonium ion and its alkyl chains was observed. The resulting material had low organic content from the ammonium salt (e.g., 15 wt % loss when heated to 600° C. in Thermogravimetric Analysis).

Figure 4:
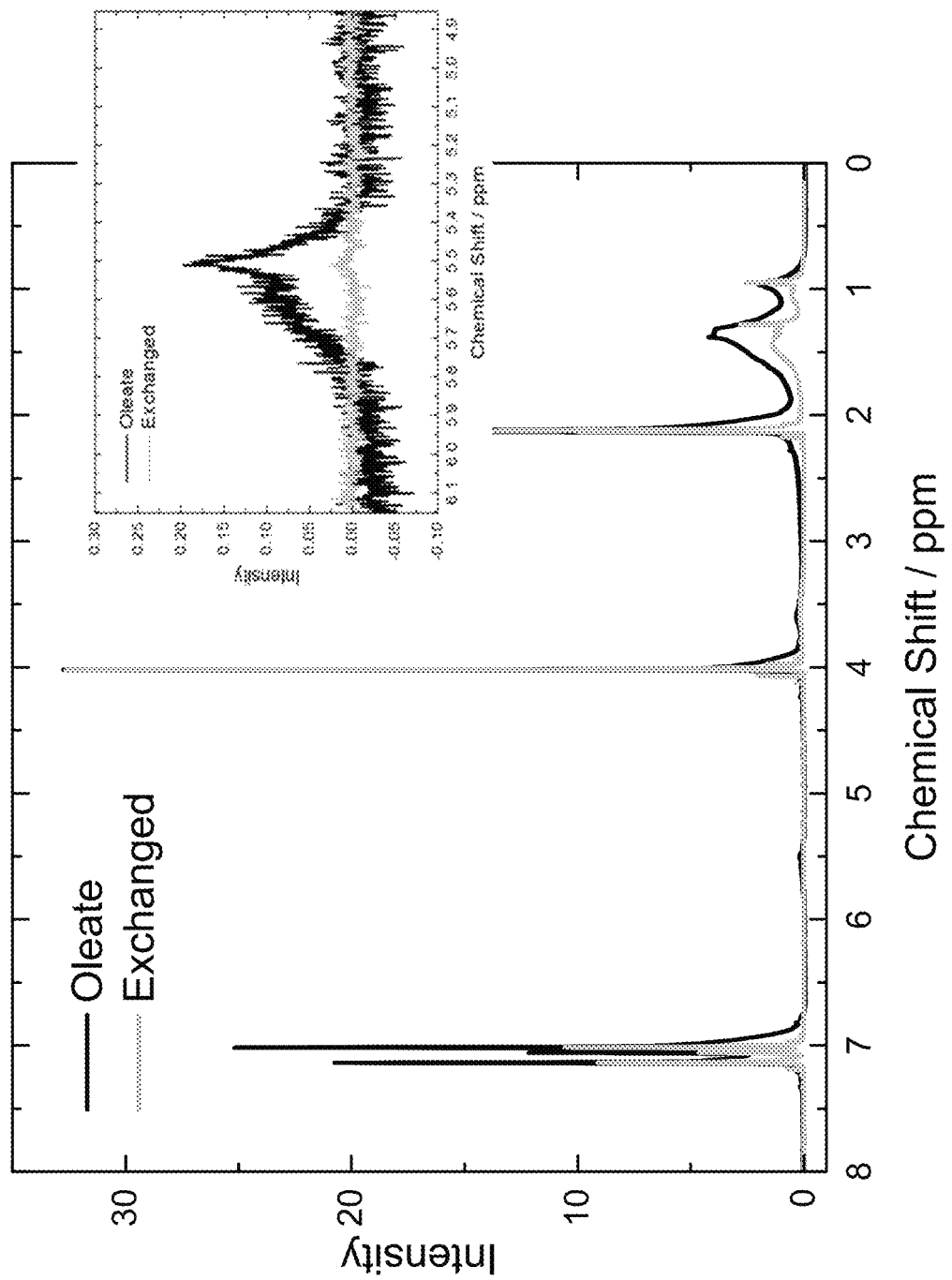
FIG. 4 shows $^1$H NMR spectra of nanostructures capped with oleate; and nanostructures capped with fluorozincate ligands and didodecyldimethylammonium counterions. The inset shows an enlarged view of the alkylene region.
Figure 5:
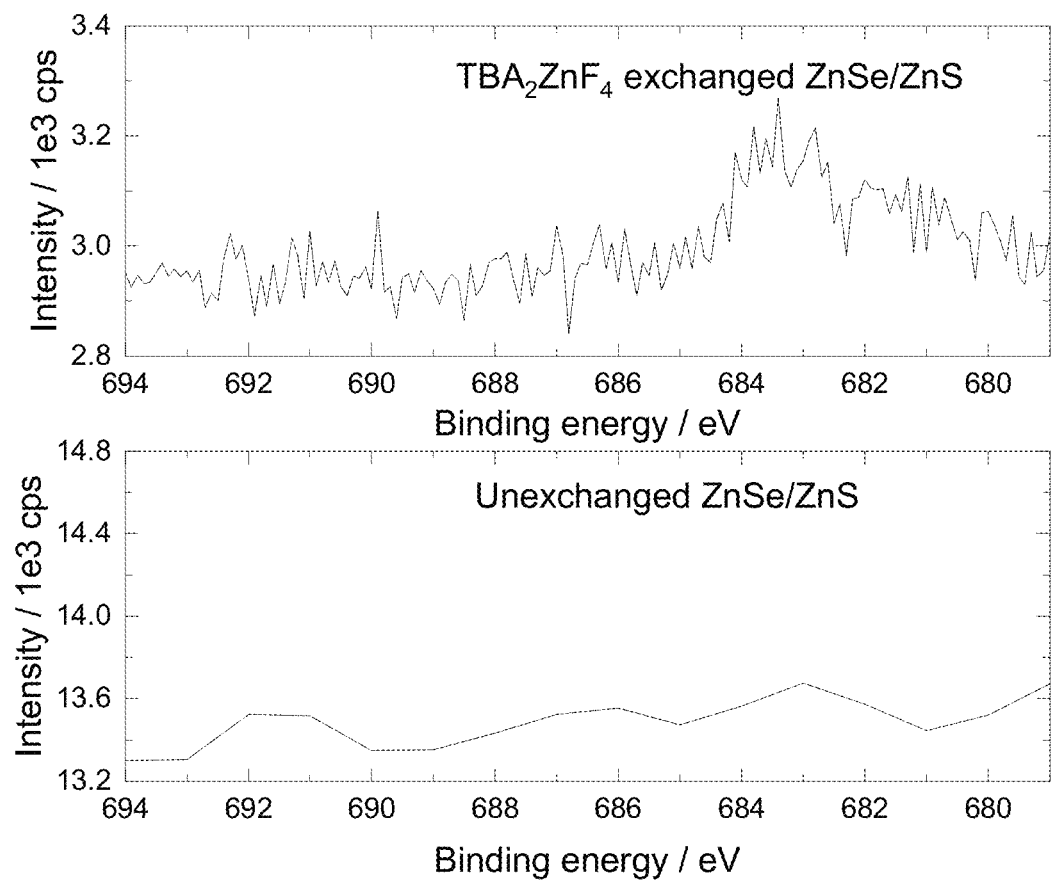
FIG. 5 shows XPS spectra (F is region) of $TBA_2ZnF_4$ exchanged blue ZnSe/ZnS nanostructures compared to unexchanged nanostructures.

Further evidence for removal of the native oleate ligands was provided by $^1$H NMR spectroscopy which showed only little residual signal in the alkylene region of 5.4-5.8 ppm after exchange (FIG. 4). FIG. 4 shows $^1$H NMR spectra of nanostructures capped with oleate; and nanostructures capped with fluorozincate ligands and didodecyldimethylammonium counterions (Sample 7 in Table 1). $^1$H NMR spectra were taken on 20 mg/mL nanostructure solutions in toluene-d8 with internal ferrocene standard. The inset showed an enlarged view of the alkylene region. For the native ligand sample, the broad and sharp signal in this region was indicative of the double bond in bound and free oleate ligands, respectively. Finally, the presence of the inorganic ligands was confirmed by X-ray photoelectron spectroscopy which showed a significant F 1s signal for a blue nanostructure exchanged with $TBA_2ZnF_4$ (FIG. 5). FIG. 5 shows XPS spectra (F is region) of $TBA_2ZnF_4$ exchanged blue ZnSe/ZnS nanostructures (Sample 8) compared to unexchanged nanostructures (Comparative Sample 2). The measured F/Zn ratio was 0.32.

Table 1 lists examples of nanostructure/ligand/surfactant/solvent combinations that were obtained via the procedure described above and the corresponding solution photoluminescence properties. The emission peak wavelength showed red shift only slightly by up to 5 nm. The quantum yield showed a decrease due to the ligand exchange by 2 to 27 percentage points. The fluorozincate ligands showed the best quantum yield preservation and were thus investigated in electroluminescent devices.

TABLE 1

Samples of different nanostructures, inorganic ligands, and surfactant/solvent combinations that resulted in colloidally stable solutions, and the corresponding photoluminescence peak wavelength and quantum yield.

| Sample | Nanostructure | Ligand | Surfactant | Solvent | PWL/nm | quantum yield |
|---|---|---|---|---|---|---|
| Comp. 1 | Red (InP/ZnSe/ZnS) | Oleate (native) | — | Octane | 625 | 83% |
| 1 | Red | $K_2ZnCl_4$ | TBABr | NMF | 630 | 56% |
| 2 | Red | $K_2ZnCl_4$ | TMAOAc | NMF | 629 | 67% |
| 3 | Red | $K_2ZnCl_4$ | DDABr | Toluene | 627 | 70% |
| 4 | Red | $TBA_2ZnF_4$ | DDACl | Toluene | 629 | 70% |
| 5 | Red | $TMA_2ZnCl_4$ | DDACl | Toluene | 626 | 68% |
| 6 | Red | $K_2ZnCl_2F_2$ | DDACl | Octane | 628 | 75% |
| 7 | Red | $ZnF_2$ | DDACl | Octane | 625 | 81% |
| Comp. 2 | Blue (ZnSe/ZnS) | Oleate | — | Octane | 433 | 80% |
| 8 | Blue | $TBA_2ZnF_4$ | DDACl | Octane | 434 | 66% |

* TBA: Tetrabutylammonium,
TMA: Tetramethylammonium

Table 2 showed that the external quantum efficiency of such devices was lower, but the stability as measured by the time under operation to reach 50% of initial luminance (500 nits) was improved unexpectedly by an order of magnitude.

TABLE 2

Efficiency and lifetime characteristics of electroluminescent devices containing red nanostructures exchanged with different inorganic ligands.

| Example | Ligand | Max. EQE | T80 @ 500 nits/s | T50 @ 500 nits/h |
|---|---|---|---|---|
| Comp. 1 | Oleate (native) | 10.2% | 26 | — |
| 3 | $K_2ZnCl_4$ | 3.9% | 8 | — |
| 4 | $TBA_2ZnF_4$ | 1.9% | 541 | — |
| 5 | $TMA_2ZnCl_4$ | 2.7% | 43 | — |
| Comp. 1 | Oleate (native) | 8.9% | 255 | 0.8 |
| 4 | $TBA_2ZnF_4$ | 4.2% | 401 | 9.6 |

TABLE 2-continued

Efficiency and lifetime characteristics of electroluminescent devices containing red nanostructures exchanged with different inorganic ligands.

| Example | Ligand | Max. EQE | T80 @ 500 nits/s | T50 @ 500 nits/h |
|---|---|---|---|---|
| 6 | $K_2ZnCl_2F_2$ | 2.4% | 118 | 6.3 |
| 7 | $ZnF_2$ | 6.9% | 588 | 6.7 |

Example 2

Ligand Exchange with TBAF and Property of Nanostructures

Carboxylate ligands were exchanged for fluoride ligands by using tetrabutyammonium fluoride (TBAF). The presence of the highly soluble tetrabutylammonium cation as a counterion ensures that exchanged quantum dots remain in solution. In contrast, the conventional zinc fluoride exchange described in Example 1 is accompanied by precipitation and the subsequent redispersion with the help of long chain alkylammonium halide which only partially disaggregates the exchanged quantum dots. FIG. 6 is a flow chart showing a ligand exchange procedure from carboxylate-capped nanostructures to fluoride-capped nanostructures.

The redispersion step using didodecyldimethylammonium chloride (DDAC) is still used in the ligand exchange with TBAF because TBA+ alone did not result in octane-soluble exchanged quantum dots. Octane is the preferred solvent for device fabrication as it does not damage the underlying layers when quantum dots are deposited.

Figure 7:
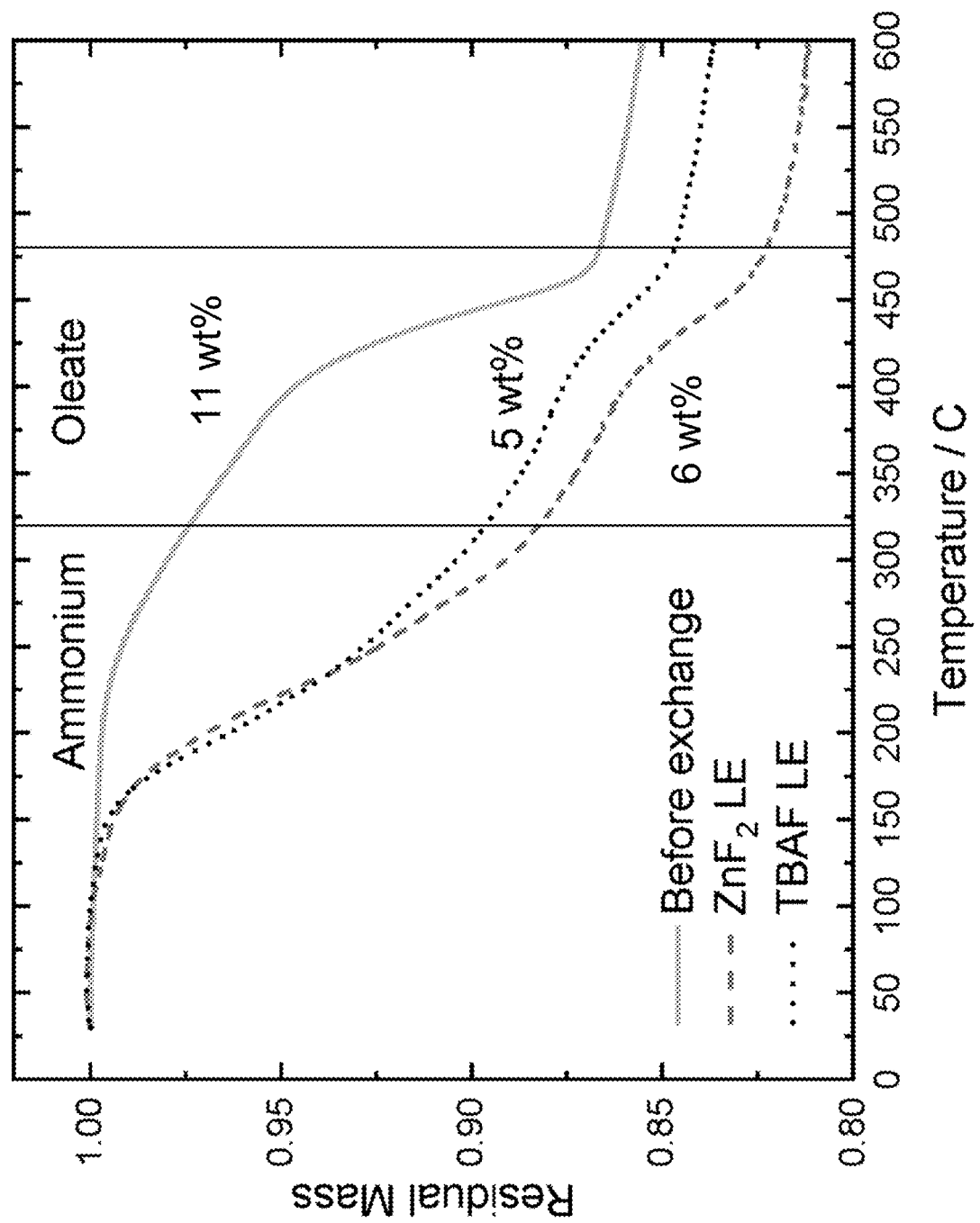
FIG. 7 shows a thermogravimetric analysis of quantum dots with organic (before exchange) ligands and inorganic ($ZnF_2$ ligand exchanged and TBAF ligand exchanged) ligands that shows the significant removal of carboxylate (oleate), in particular with the quantum dots with inorganic ligands, by decomposition in the temperature range of 320° C. to 480° C.

Thermogravimetric analysis as shown in FIG. 7 shows that most of the carboxylate ligand (zinc oleate) is removed by both ligand exchange procedures using $ZnF_2$ or TBAF. The weight loss in the temperature range of 320° C. to 480° C. which is assigned to zinc oleate is reduced from 11% (by weight) before ligand exchange to 5-6% (by weight) after ligand exchange. The loss of weight at a lower temperature for $ZnF_2$ is associated with the alkylammonium surfactant added for redispersion.

Figure 8:
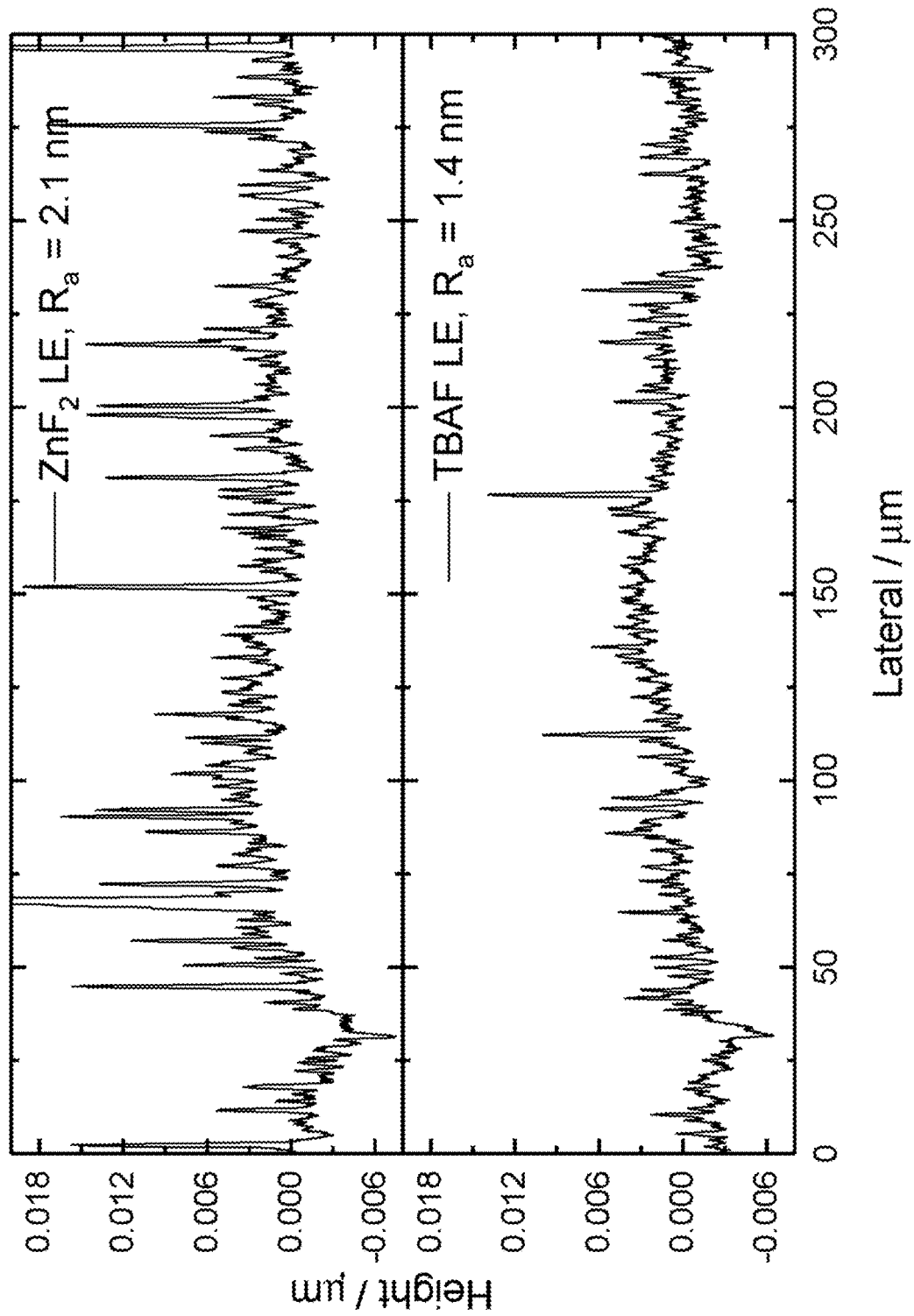
FIG. 8 shows the height profiles and average roughness of thin films of ligand exchanged quantum dots after $ZnF_2$ ligand exchange and TBAF ligand exchange. The quantum dots after $ZnF_2$ ligand exchange shows significantly more spikes and increased roughness due to the formation of quantum dot aggregates.

As shown in FIG. 8, spin-coated films of TBAF-exchanged quantum dots show fewer spikes due to aggregates and lower average roughness in stylus profilometry compared to thin films prepared using $ZnF_2$-exchanged quantum dots.

Figure 9:
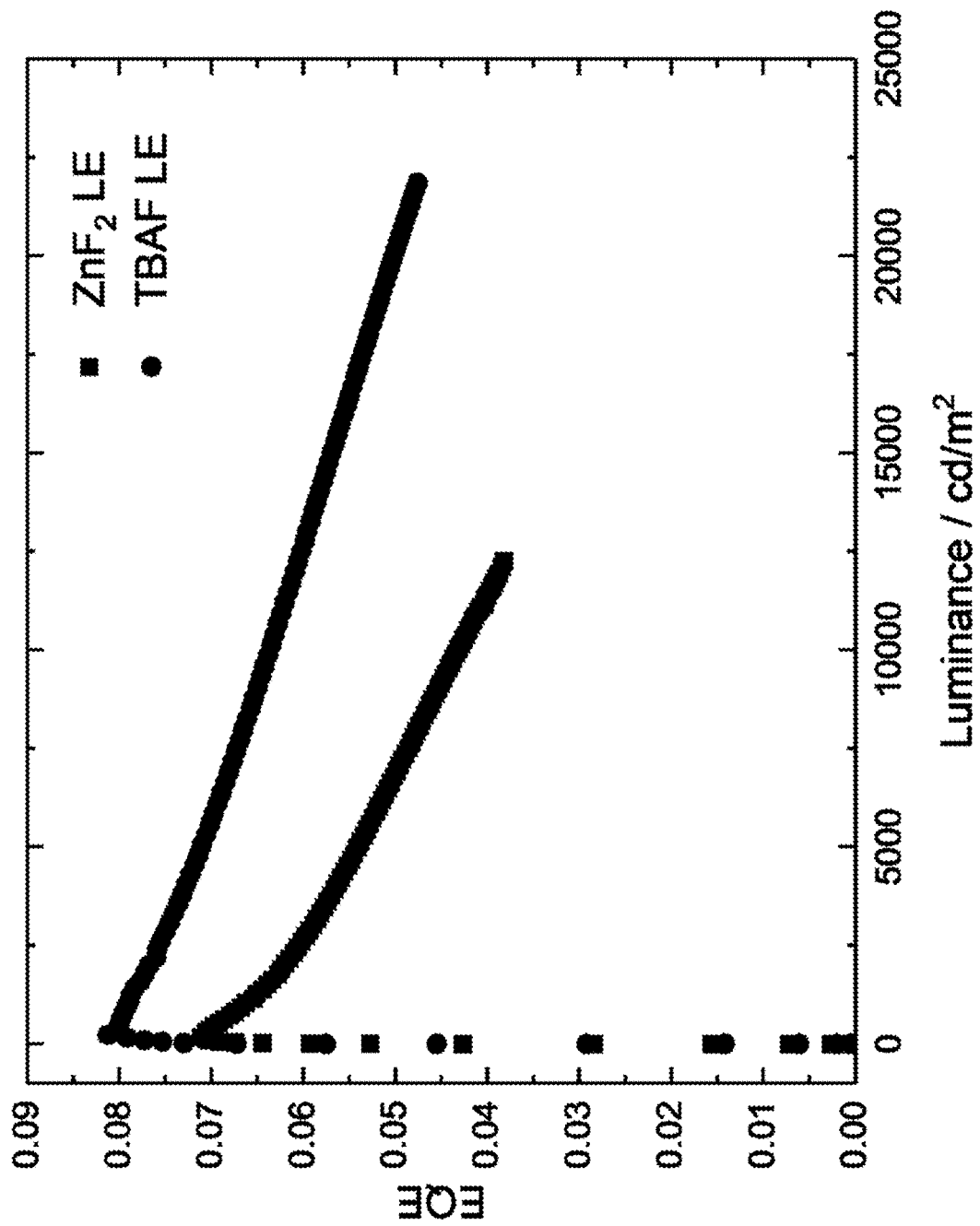
FIG. 9 is a graph showing the efficiency over luminance for electroluminescent devices made with quantum dots after $ZnF_2$ ligand exchange and TBAF ligand exchange.

And, electroluminescent devices made with TBAF-exchanged quantum dots show higher luminance and higher efficiency than devices prepared using $ZnF_2$-exchanged quantum dots as shown in FIG. 9. In addition, the device lifetime is increased by a factor of 4 for devices made using TBAF-exchanged red InP quantum compared to $ZnF_2$-exchanged InP quantum dots as shown in TABLE 3. Overall, the TBAF-exchanged quantum dots shown superior properties compared to the $ZnF_2$-exchanged quantum dots when used in electroluminescent devices.

TABLE 3

Device efficiency and lifetime of electroluminescent devices

| Quantum Dot | Max EQE (%) | EQE at 10 mA/cm² (%) | $T_{95}$/hour | $T_{80}$/hour | $T_{50}$/hour |
|---|---|---|---|---|---|
| $ZnF_2$-exchanged InP red | 7.1 | 6.8 | 0.006 | 0.14 | 6.4 |
| TBAF-exchanged InP red | 8.1 | 8.0 | 0.036 | 1.91 | 80.9 |

Having now fully described this invention, it will be understood by those of ordinary skill in the art that the same can be performed within a wide and equivalent range of conditions, formulations and other parameters without affecting the scope of the invention or any embodiment thereof. All patents, patent applications, and publications cited herein are fully incorporated by reference herein in their entirety.

What is claimed is:

1. A nanostructure composition comprising:
   (a) at least one population of nanostructures; and
   (b) at least one fluoride containing ligand bound to the surface of the nanostructure; wherein the fluoride containing ligand is selected from the group consisting of a fluorozincate, tetrafluoroborate, and hexafluorophosphate; or
   (b') fluoride anions bound to the surface of the nanostructure; and
   wherein the nanostructure composition exhibits a photoluminescence quantum yield of between about 70% and about 90%.

2. The nanostructure composition of claim 1, wherein the nanostructures comprise a core that comprises InP.

3. The nanostructure composition of claim 1, wherein the nanostructures comprise at least one shell that comprises a first shell comprising ZnSe and a second shell comprising ZnS.

4. The nanostructure composition of claim 3, wherein the molar ratio of fluorine atom in the fluoride containing ligand or fluoride anions bound to the nanostructure composition to zinc atom in the nanostructure composition is about 0.32.

5. The nanostructure composition of claim 1, wherein at least one fluoride containing ligand comprises an anion comprising fluorozincate and a cation comprising a metal ion.

6. The nanostructure composition of claim 1, wherein at least one fluoride containing ligand comprises an anion comprising a fluorozincate and a cation selected from the group consisting of a tetraalkylammonium, an alkylphosphonium, formamidinium, guanidinium, imidazolium, and pyridinium.

7. The nanostructure composition of claim 1, further comprising a surfactant.

8. The nanostructure composition of claim 1, wherein the nanostructure composition exhibits a photoluminescence peak wavelength of between about 600 nm and about 650 nm.

9. The nanostructure composition of claim 1, wherein the fluoride containing ligand is a tetrabutylammonium tetrafluorozincate or tetrabutylammonium dichlorodifluorozincate.

10. The nanostructure composition of claim 1, wherein the
nanostructures comprise a core comprising InP, at least one shell comprising ZnSe, at least one shell comprising ZnS, and at least one fluoride containing ligand comprising tetrafluorozincate or dichlorodifluorozincate.

11. A method of preparing a nanostructure composition, the method comprising:
(a) providing at least one population of nanostructures; and
(b) admixing at least one fluoride containing ligand with the nanostructures of (a), wherein the fluoride containing ligand is selected from the group consisting of a fluorozincate, tetrafluoroborate, and hexafluorophosphate; or
(b') admixing tetraalkylammonium fluoride with the nanostructure of (a);
to produce a nanostructure composition; and
wherein the nanostructure composition exhibits a photoluminescence quantum yield of between about 70% and about 90%.

12. The method of claim 11, wherein the nanostructures comprise a core and at least one shell, wherein the core comprises InP.

13. The method of claim 11, wherein the nanostructures comprise a core and at least one shell, wherein the at least one shell comprises a first shell comprising ZnSe and a second shell comprising ZnS.

14. A film comprising at least one population of nanostructures, wherein the nanostructures comprise:
(a) at least one population of nanostructures, the nanostructures comprising a core and at least one shell; and
(b) at least one fluoride containing ligand bound to the surface of the nanostructure; wherein the fluoride containing ligand is selected from the group consisting of a fluorozincate, tetrafluoroborate, and hexafluorophosphate; or
(b') fluoride anions bound to the surface of the nanostructure; and
wherein the population of nanostructures exhibits a photoluminescence quantum yield of between about 70% and about 90%.

15. The film of claim 14, wherein the nanostructures comprise a core of InP.

16. The film of claim 14, wherein the nanostructures comprise a core and at least one shell, wherein at least one shell comprises a first shell comprising ZnSe and a second shell comprising ZnS.

17. A molded article comprising the film of claim 14.

18. The molded article of claim 17, wherein the molded article is an electroluminescent device.

19. The molded article of claim 18, wherein the electroluminescent device reaches 50% of initial luminance after between about 6 hours and about 11 hours.

* * * * *

UNITED STATES PATENT AND TRADEMARK OFFICE
CERTIFICATE OF CORRECTION

PATENT NO. : 11,268,022 B2  
APPLICATION NO. : 16/824824  
DATED : March 8, 2022  
INVENTOR(S) : Ippen et al.

Page 1 of 1

It is certified that error appears in the above-identified patent and that said Letters Patent is hereby corrected as shown below:

In the Specification

In Column 7, Line 62, delete "is" and insert --1s--, therefor.

In Column 20, Line 62, delete "AN," and insert --AlN,--, therefor.

In Column 42, Line 15, delete "is" and insert --1s--, therefor.

Signed and Sealed this  
Twenty-eighth Day of June, 2022

Katherine Kelly Vidal  
*Director of the United States Patent and Trademark Office*